United States Patent
Kim et al.

(10) Patent No.: US 7,336,554 B2
(45) Date of Patent: Feb. 26, 2008

(54) SEMICONDUCTOR MEMORY DEVICE HAVING A REDUCED NUMBER OF PINS

(75) Inventors: Kyu-Hyoun Kim, Suwon-si (KR); Chang-Hyun Kim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/258,565

(22) Filed: Oct. 25, 2005

(65) Prior Publication Data
US 2006/0120359 A1 Jun. 8, 2006

(30) Foreign Application Priority Data
Oct. 25, 2004 (KR) .................. 10-2004-0085504

(51) Int. Cl.
*G11C 7/00* (2006.01)
*G11C 7/10* (2006.01)
(52) U.S. Cl. ............ 365/219; 365/189.02; 365/189.03
(58) Field of Classification Search .............. 365/219
See application file for complete search history.

(56) References Cited

U.S. PATENT DOCUMENTS

| | | | | |
|---|---|---|---|---|
| 4,847,867 A | * | 7/1989 | Nasu et al. ................ | 375/257 |
| 5,086,388 A | * | 2/1992 | Matoba et al. ............. | 710/71 |
| 5,371,714 A | * | 12/1994 | Matsuda et al. ........ | 365/230.03 |
| 5,473,577 A | | 12/1995 | Miyake et al. | |
| 5,845,108 A | | 12/1998 | Yoo et al. .................. | 395/551 |
| 6,272,053 B1 | * | 8/2001 | Choi .................... | 365/189.03 |
| 6,327,206 B2 | * | 12/2001 | Kubota et al. ............. | 365/219 |
| 6,772,251 B1 | * | 8/2004 | Hastings et al. ........... | 710/100 |
| 2004/0252689 A1 | * | 12/2004 | Park et al. ................. | 370/389 |
| 2006/0123164 A1 | * | 6/2006 | Rai et al. .................... | 710/62 |
| 2006/0123306 A1 | * | 6/2006 | Whetsel .................... | 714/744 |

FOREIGN PATENT DOCUMENTS

| | | |
|---|---|---|
| JP | 2001-092771 | 4/2001 |
| KR | 2003-0057642 | 7/2003 |
| KR | 10-1994-0022553 | 1/2006 |

* cited by examiner

*Primary Examiner*—Son L. Mai
(74) *Attorney, Agent, or Firm*—Mills & Onello, LLP

(57) ABSTRACT

A semiconductor memory device includes an IO circuit for receiving or outputting command signals, address signals and data which are serialized and an IO signal control circuit for parallel converting the serialized command signals, address signals and data inputted through the IO circuit and applying the parallel converted signals to an internal portion and serial converting parallel data applied from the internal portion and outputting the serial converted data to the IO circuit.

33 Claims, 14 Drawing Sheets

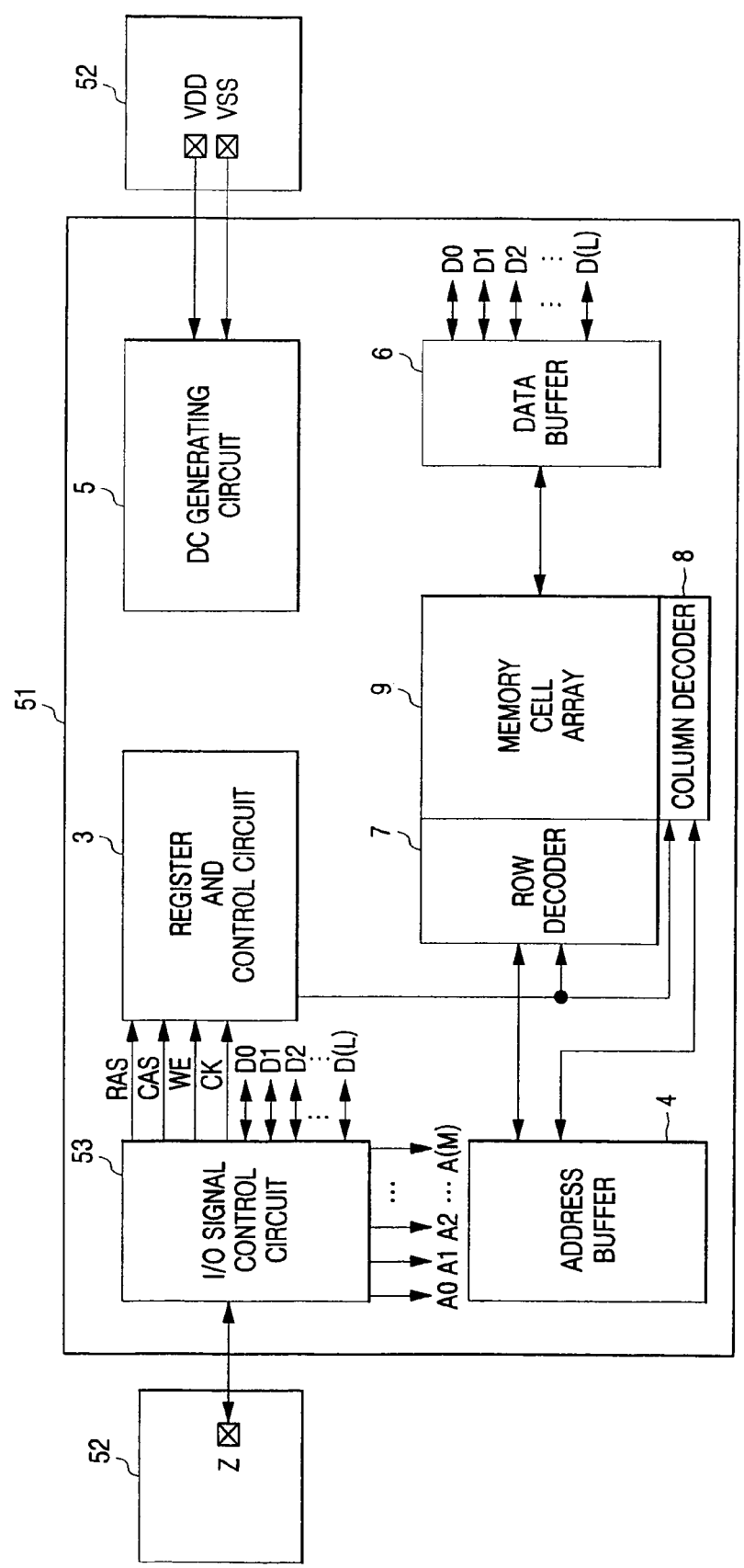

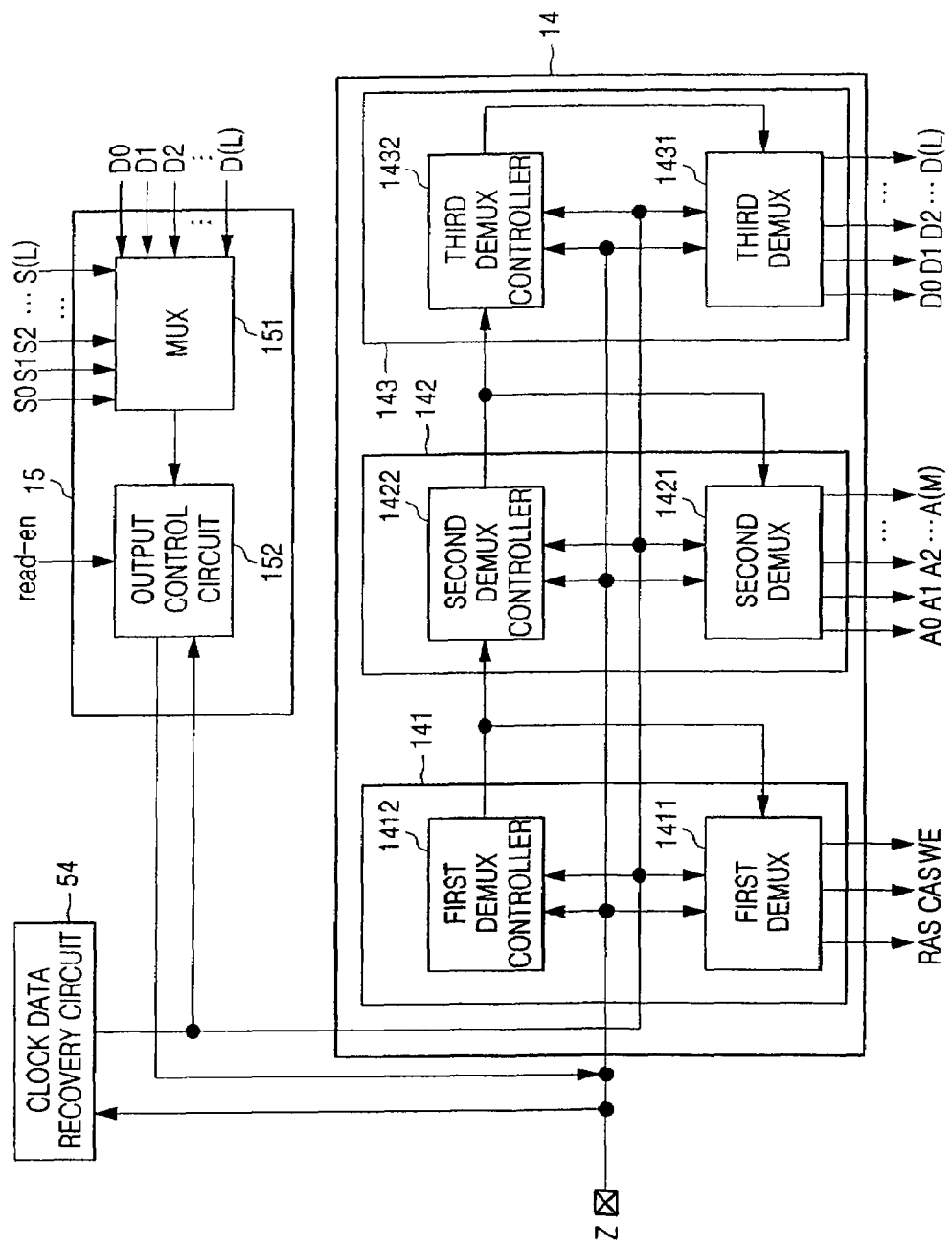

SEMICONDUCTOR MEMORY DEVICE HAVING A REDUCED NUMBER OF PINS

CROSS-REFERENCE TO RELATED APPLICATION

This application claims the benefit of Korean Patent Application No. 2004-85504, filed Oct. 25, 2004, the contents of which are hereby incorporated herein by reference in their entirety.

BACKGROUND OF THE INVENTION

1. Field of the Invention

The present invention relates to a semiconductor memory device and, more particularly, to a semiconductor memory device which reduces the number of pins for packaging.

2. Description of the Related Art

A semiconductor memory device is a device which can write data from an external portion and read the data again after a predetermined time. Signals related to the external portion include address signals for selecting a certain cell, command signals which control whether to read or write data, and data which is to be written/read to/from a certain cell. Typically, the signals are transmitted through separate pins.

FIG. 1 is a block diagram illustrating a conventional semiconductor memory device. The semiconductor memory device of FIG. 1 includes an internal circuit 1 a plurality of pins 2. The internal circuit 1 includes a register and control circuit 3, an address buffer 4, a DC generating circuit 5, a data buffer 6, a row decoder 7, a column decoder 8, and a memory cell array 9.

A plurality of pins 2 correspond to command signals RAS, CAS and WE, clock signals CK, address signals A[N:0], a power voltage VDD, a ground voltage VSS, and data DQ[M:0] to apply the signals applied externally and data to the internal circuit 1 and transmit the data to the external portion from the internal circuit 1.

The above components of FIG. 1 operate as follows in response to the command signals RAS, CAS and WE, the clock signals CK, the address signals A[N:0], the power voltage VDD, the ground voltage VSS, and the data DQ[M:0] which are applied through a plurality of pins 2.

The register and control circuit 2 receives and combines the external command signals CS, RAS, CAS, and WE which are transmitted through pins corresponding to the external command signals CS, RAS, CAS, and WE to determine operation status of the semiconductor memory device and generate control signals based on the determined operation status.

The address buffer 4 receives the address signals A[N:0] which are parallel-transmitted through pins corresponding to the address signals A[N:0] to generate a row address and a column address, and transmits the row address to the row decoder 7 and the column address to the column decoder 8.

The DC generating circuit 5 receives the power voltage VDD and the ground voltage VSS through pins corresponding to the power voltage VDD and the ground voltage VSS to generate voltages VPP, VBB, IVC, and VREF which are required by the semiconductor memory device.

The data buffer 6 is connected to pins corresponding to the data DQ[M:0], and applies data DQ[M:0], which are parallel-inputted, to the memory cell array 9 and parallel-outputs data DQ[M:0], which are parallel-inputted from the memory cell array 9, to pins corresponding to the data DQ[M:0].

The row decoder 7 receives the row address signals from the address buffer 4 to generate a word line selecting signal, and receives the column address signals from the address buffer 4 to generate a column selecting signal.

The memory cell array 9 writes/reads data to/from the memory cell array selected in response to the word line selecting signal and the column selecting signal.

As described above, the conventional semiconductor memory device has a plurality of pins respectively corresponding the signals and data, applies the transmitted signals to the internal circuit 1 to perform operations corresponding to the signals, and transmits data outputted from the internal circuit 1 to the external portion through a plurality of pins.

As the semiconductor memory device has more functions and achieves high integration, more signals and data are inputted and outputted, and thus the number of pins is increased to correspond to the increased signals and data.

In this case, however, integrating a lot of pins in a limited space causes many problems in packaging.

In addition, an electrical current consumed by the pins increases in proportion to the increased number of pins, leading to high power consumption.

SUMMARY OF THE INVENTION

It is a feature of the present invention to provide a semiconductor memory device which serializes the command signals, the address signals and data and thus receives or outputs the command signals, the address signals and data which are serialized through one pin, thereby improving packaging and reducing power consumption related to pins.

According to a first aspect, the invention is directed to a semiconductor memory device. The device includes an IO circuit for receiving or outputting command signals, address signals and data which are serialized; and an IO signal control circuit for parallel converting the serialized command signals, address signals and data inputted through the IO circuit and applying the parallel converted signals to an internal circuit, and serial converting parallel data applied from the internal circuit and outputting the serial converted signals to the IO circuit. In one embodiment, wherein the IO signal control circuit includes: a serial to parallel converting portion for parallel converting the serialized command signals, address signals and data inputted through the IO circuit and applying the parallel converted signals to the internal portion; and a parallel to serial converting portion for serial converting parallel data applied from the internal portion and outputting the serial converted signals to the IO circuit.

In one embodiment, the serial to parallel converting portion includes: a command signal serial to parallel converting portion for acquiring and parallel converting the serialized command signals among the serialized command signals, address signals and data inputted through the IO circuit and applying the parallel converted command signals to the internal portion; an address signal serial to parallel converting portion for acquiring and parallel converting the serialized address signals among the serialized command signals, address signals and data inputted through the IO circuit and applying the parallel converted address signals to the internal portion; and a data serial to parallel converting portion for acquiring and parallel converting the serialized data among the serialized command signals, address signals and data inputted through the IO circuit and applying the parallel converted data to the internal portion.

In one embodiment, the command signal serial to parallel converting portion includes: a first DEMUX for receiving and parallel converting a predetermined bit signal corresponding to the number of the command signals; and a first DEMUX control portion for activating operation of the first DEMUX if the first DEMUX detects input of the predetermined bit signal having the command signals.

In one embodiment, the address signal serial to parallel converting portion includes: a second DEMUX for receiving and parallel converting a predetermined bit signal corresponding to the number of the address signals; and a second DEMUX control portion for activating operation of the second DEMUX if the second DEMUX detects input of the predetermined bit signal having the address signals.

In one embodiment, the data serial to parallel converting portion includes: a third DEMUX for receiving and parallel converting a predetermined bit signal corresponding to the number of the address signals; and a third DEMUX control portion for activating operation of the third DEMUX if the third DEMUX detects input of the predetermined bit signal having the data.

In one embodiment, the parallel to serial converting portion includes a MUX for serial converting data parallel-inputted from the internal portion. In one embodiment, the parallel to serial converting portion further includes an output control portion which receives an output signal of the MUX and outputs the output signal of the MUX to the IO circuit only when the semiconductor memory device performs a read operation.

In one embodiment, the IO circuit includes first and second combined terminals, the first combined terminal receives the serialized command signals, address signals and data, and the second combined terminal outputs the serialized data. In one embodiment, the IO signal control circuit includes: a serial to parallel converting portion for parallel converting the serialized command signals, address signals and data inputted through the first combined terminal and applying the parallel converted signals to the internal portion; and a parallel to serial converting portion for serial converting parallel data applied from the internal portion and outputting the serial converted data to the second combined terminal. In one embodiment, the serial to parallel converting portion includes: a command signal serial to parallel converting portion for acquiring and parallel converting the serialized command signals among the serialized command signals, address signals and data inputted through the first combined terminal and applying the parallel converted command signals to the internal portion; an address signal serial to parallel converting portion for acquiring and parallel converting the serialized address signals among the serialized command signals, address signals and data inputted through the first combined terminal and applying the parallel converted address signals to the internal portion; and a data serial to parallel converting portion acquiring and parallel converting the serialized data among the serialized command signals, address signals and data inputted through the first combined terminal and applying the parallel converted data to the internal portion.

In one embodiment, the IO circuit includes first and second combined terminals, the first combined terminal receives the serialized command signals and address signals, and the second combined terminal outputs the serialized data.

In one embodiment, the IO signal control circuit includes: a serial to parallel converting portion for parallel converting the serialized command signals and address signals inputted through the first combined terminal and applying the parallel converted command signals and address signals to the internal portion; and a serial and parallel converting portion for parallel converting parallel data applied through the second combined terminal and applying the parallel converted data to the internal portion, and serial converting data inputted from the internal portion and outputting the serial converted data to the second combined terminal. In one embodiment, the serial to parallel converting portion includes: a command signal serial to parallel converting portion for acquiring and parallel converting the serialized command signals among the serialized command signals, address signals and data inputted through the first combined terminal and applying the parallel converted command signals to the internal portion; and an address signal serial to parallel converting portion for acquiring and parallel converting the serialized address signals among the serialized command signals, address signals and data inputted through the first combined terminal and applying the parallel converted address signals to the internal portion. In one embodiment, the serial and parallel converting portion includes: a data serial to parallel converting portion for acquiring and parallel converting the serialized data among the serialized command signals, address signals and data inputted through the second combined terminal; and a data parallel to serial converting portion for serial converting data parallel-inputted from the internal portion.

According to another aspect, the invention is directed to a semiconductor memory device, comprising: an IO circuit including two combined terminals and a clock terminal, the two combined terminals receiving or outputting command signal pairs, address signal pairs and data pair which are serialized, the clock terminal receiving a clock signal; an IO signal control circuit for acquiring and parallel converting command signals, address signals and data which are serialized and applying the parallel converted signals to an internal portion if the serialized command signal pairs, address signal pairs and data pair are received through the two combined terminals, and converting parallel data inputted from the internal portion to a serialized data pair and outputting the serialized data pair to the two combined terminals; and a clock converting portion for multiplying the clock signal inputted through the clock terminal and outputting the multiplied clock signal as an internal clock signal.

In one embodiment, the clock converting portion comprises a phase locked loop (PLL) for multiplying the clock signal.

In one embodiment, the IO signal control portion includes: a serial to parallel converting portion for acquiring and parallel converting the command signals, address signals and data which are serialized and applying the parallel converted signals to the internal portion if the serialized command signal pairs, address signal pairs and data pair are received through the two combined terminals; and a parallel to serial converting portion for converting parallel data inputted from the internal portion to the serialized data pair and applying serialized data pair to the two combined terminals.

In one embodiment, the serial to parallel converting portion includes: a signal acquiring means for comparing voltage levels of the serialized command signal pairs, address signal pairs and data pair and acquiring serialized command signals, address signals and data having voltage level based on the comparison result; a command signal serial to parallel converting portion for acquiring and parallel converting the serialized command signals among the serialized command signals, address signals and data inputted through the IO circuit and applying the parallel converted command signals to the internal portion; an address signal serial to parallel converting portion for acquiring and parallel converting the serialized address signals among the serialized command signals, address signals and data inputted through the IO circuit and applying the parallel converted address signals to the internal portion; and a data serial to parallel converting portion acquiring and parallel converting the serialized data among the serialized command signals, address signals and data inputted through the IO circuit and applying the parallel converted data to the internal portion. In one embodiment, the command signal serial to parallel converting portion includes: a first DEMUX for receiving and parallel converting a predetermined bit signal corresponding to the number of the command signals; and a first DEMUX control portion for activating operation of the first DEMUX if the first DEMUX detects input of the predetermined bit signal having the command signals. In one embodiment, the address signal serial to parallel converting portion includes: a second DEMUX for receiving and parallel converting a predetermined bit signal corresponding to the number of the address signals; and a second DEMUX control portion for activating operation of the second DEMUX if the second DEMUX detects input of the predetermined bit signal having the address signals. In one embodiment, the data serial to parallel converting portion includes: a third DEMUX for receiving and parallel converting a predetermined bit signal corresponding to the number of the address signals; and a third DEMUX control portion for activating operation of the third DEMUX if the third DEMUX detects input of the predetermined bit signal having the data.

In one embodiment, the parallel to serial converting portion includes: a MUX for serial converting data parallel-inputted from the internal portion; and an output control portion for converting data of the MUX to a data pair and outputting the data pair to the two combined terminals according to the multiplied clock signal. In one embodiment, the output control portion further has a function for outputting the data pair to the two combined terminals only when the semiconductor memory device performs read operation.

According to another aspect, the invention is directed to a semiconductor memory device, comprising: an IO circuit for receiving or outputting command signals, address signals and data which are serialized; an IO signal control circuit for parallel converting the serialized command signals, address signals and data inputted through the IO circuit and applying the parallel converted signals to an internal portion, and serial converting parallel data applied from the internal portion and outputting the serial converted signals to the IO circuit; and a clock data recovery circuit for generating a clock signal from a signal inputted through the IO circuit.

In one embodiment, the IO signal control circuit includes: a serial to parallel converting portion for parallel converting the serialized command signals, address signals and data inputted through the IO circuit and applying the parallel converted signals to the internal portion; and a parallel to serial converting portion for serial converting parallel data applied from the internal portion and outputting the serial converted data to the IO circuit.

In one embodiment, the serial to parallel converting portion includes: a command signal serial to parallel converting portion for acquiring and parallel converting the serialized command signals among the serialized command signals, address signals and data inputted through the IO circuit and applying the parallel converted command signals to the internal portion; an address signal serial to parallel converting portion for acquiring and parallel converting the serialized address signals among the serialized command signals, address signals and data inputted through the IO circuit and applying the parallel converted address signals to the internal portion; and a data serial to parallel converting portion for acquiring and parallel converting the serialized data among the serialized command signals, address signals and data inputted through the IO circuit and applying the parallel converted data to the internal portion.

In one embodiment, the command signal serial to parallel converting portion includes: a first DEMUX for receiving and parallel converting a predetermined bit signal corresponding to the number of the command signals; and a first DEMUX control portion for activating operation of the first DEMUX if the first DEMUX detects input of the predetermined bit signal having the command signals.

In one embodiment, the address signal serial to parallel converting portion includes: a second DEMUX for receiving and parallel converting a predetermined bit signal corresponding to the number of the address signals; and a second DEMUX control portion for activating operation of the second DEMUX if the second DEMUX detects input of the predetermined bit signal having the address signals. In one embodiment, the data serial to parallel converting portion includes: a third DEMUX for receiving and parallel converting a predetermined bit signal corresponding to the number of the address signals; and a third DEMUX control portion for activating operation of the third DEMUX if the third DEMUX detects input of the predetermined bit signal having the data.

In one embodiment, the parallel to serial converting portion includes: a MUX for serial converting data parallel-inputted from the internal portion; and an output control portion which receives an output signal of the MUX and outputs the output signal of the MUX to the IO circuit only when the semiconductor memory device performs read operation.

According to another aspect, the invention is directed to an inputting and outputting method of a semiconductor memory device, comprising: parallel-converting serialized command signals, address signals and data which are inputted through a combined terminal and applying the parallel converted signals to an internal portion; and dividing the combined terminal into first and second combined terminals, receiving the serialized command signals, address signals and data through the first combined terminal and outputting the serialized data through the second combined terminal.

In one embodiment, the combined terminal is divided into first and second combined terminals, the serialized command signals and address signals are received through the first combined terminal, and the serialized data are inputted or outputted through the second combined terminal.

In one embodiment, the method further comprises receiving a clock signal inputted through a clock terminal, multiplying the clock signal and applying the multiplied clock signal to the internal portion. In one embodiment, the combined terminal is divided into first and second combined terminals, and serialized command signal pairs, address signal pairs and data pair are inputted or outputted through the first and second combined terminals according the multiplied clock signal.

In one embodiment, the method further comprises generating the clock signal from a signal inputted or outputted through the combined terminal.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

FIG. 12 is a block diagram illustrating a semiconductor memory device according to a fifth embodiment of the present invention; and FIG. 13 is a block diagram illustrating an IO signal control circuit of the semiconductor memory device of FIG. 12.

DETAILED DESCRIPTION OF THE INVENTION

Figure 2:
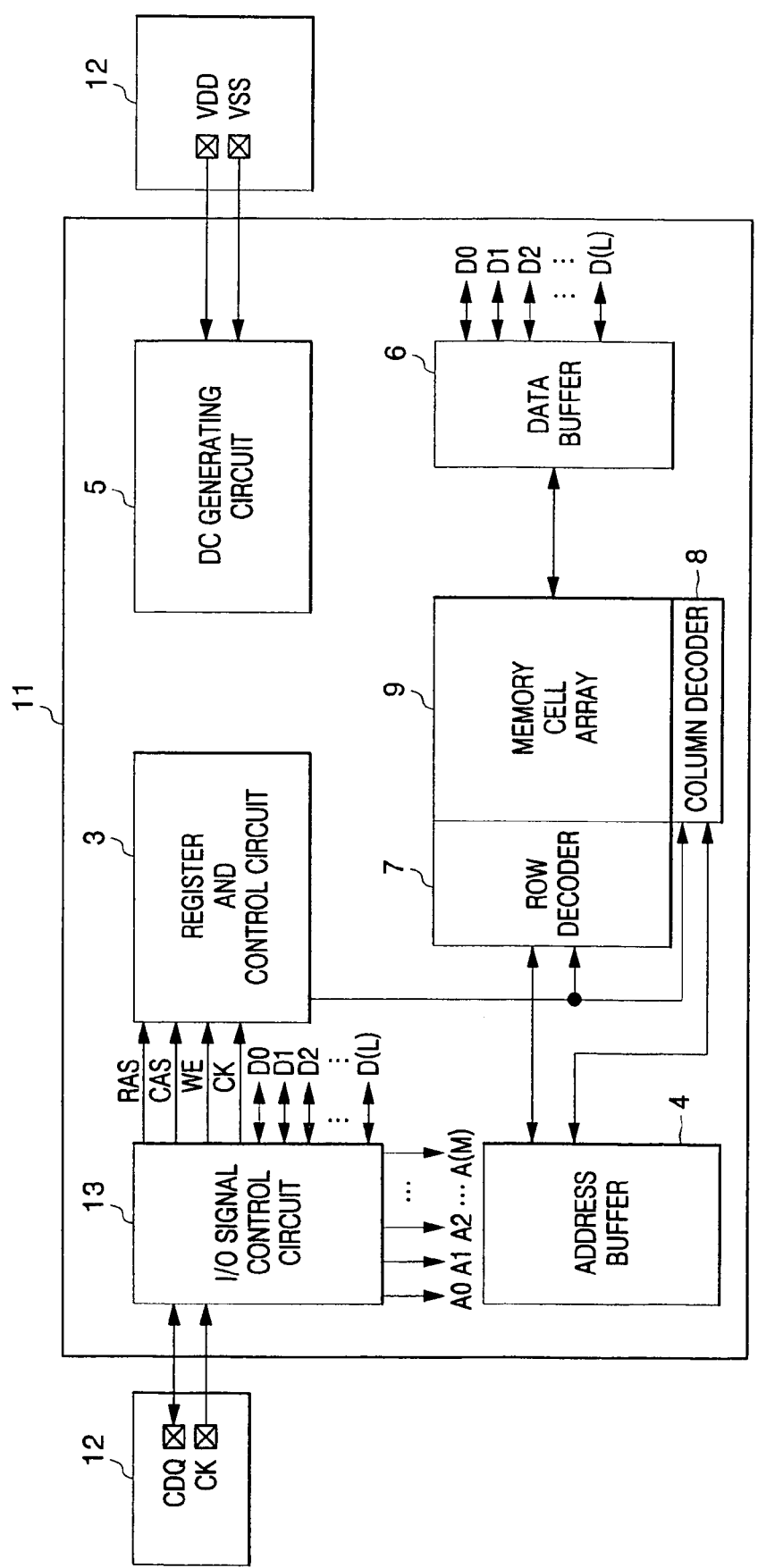
FIG. 2 is a block diagram illustrating a semiconductor memory device according to a first embodiment of the present invention.

FIG. 2 is a block diagram illustrating a semiconductor memory device according to a first embodiment of the present invention. The semiconductor memory device of FIG. 2 includes an internal circuit 11 and a plurality of pins 12. The internal circuit 11 includes a register and control circuit 3, an address buffer 4, a DC generating circuit 5, a data buffer 6, a row decoder 7, a column decoder 8, a memory cell array 9, and an IO signal control circuit 13.

A plurality of pins 12 include a combined pin CDQ to which serialized signals CDQ such as the command signals, the address signals and data which are serialized are inputted, a clock pin CK to which the clock signal CK is inputted, and a power pin VDD to which the power voltage VDD is applied, and a ground pin VSS to which the ground voltage VSS is applied.

Figure 1:
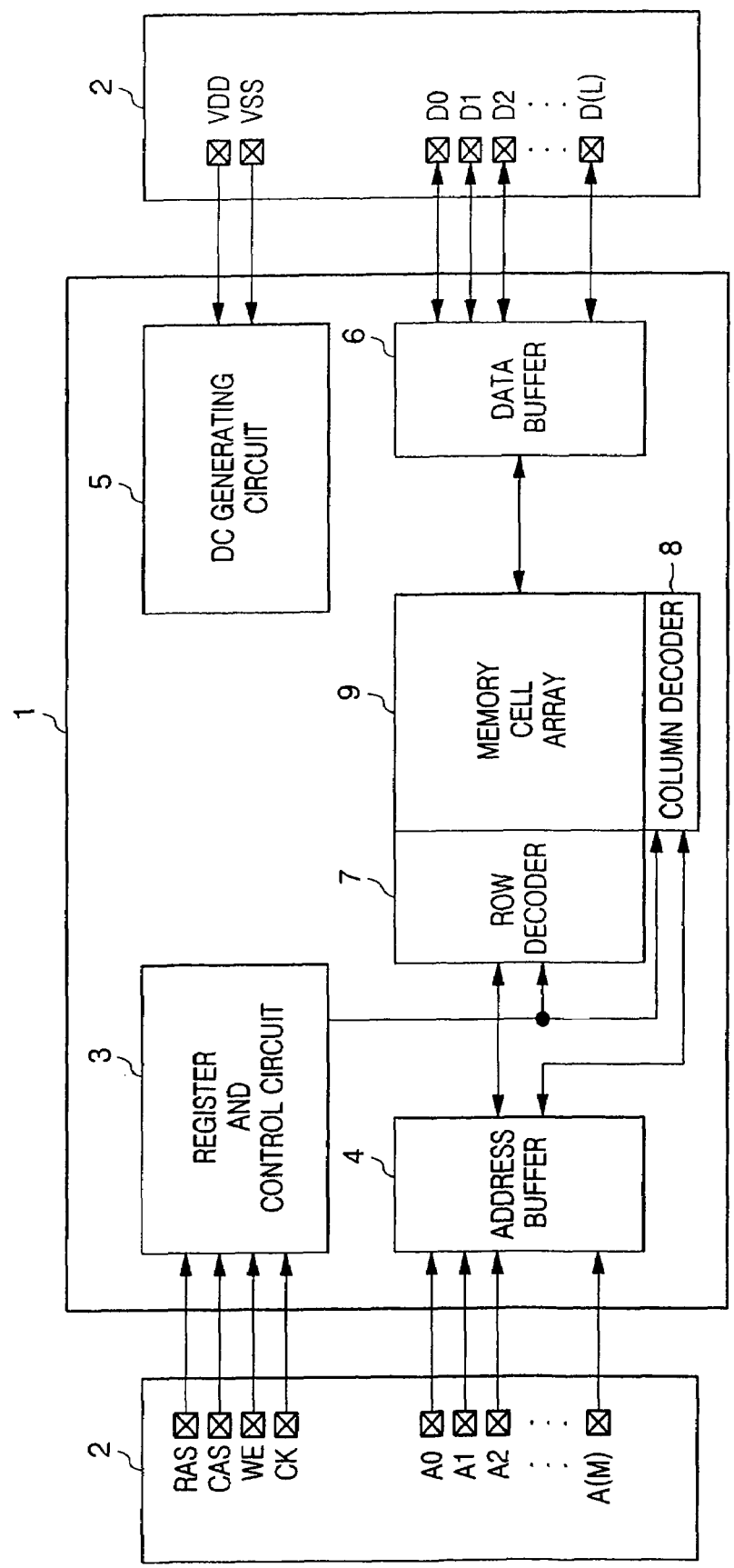
FIG. 1 is a block diagram illustrating a conventional semiconductor memory device.

Like reference numerals of FIGS. 1 and 2 denote like parts and perform like operations, and thus description of those is not repeated.

Referring back to FIG. 2, the IO signal control circuit 13 parallel-converts the serialized signal CDQ inputted from the combined pin CDQ to the command signal, the address signal and the data, and serial-converts parallel data applied from the data buffer 6. The parallel-converted command signals are transmitted to the register and control circuit 3, the parallel-converted address signals are transmitted to the address buffer 4, the parallel-converted data are transmitted to the data buffer 6, and the serial-converted data are transmitted to the combined pin CDQ.

Figure 3:
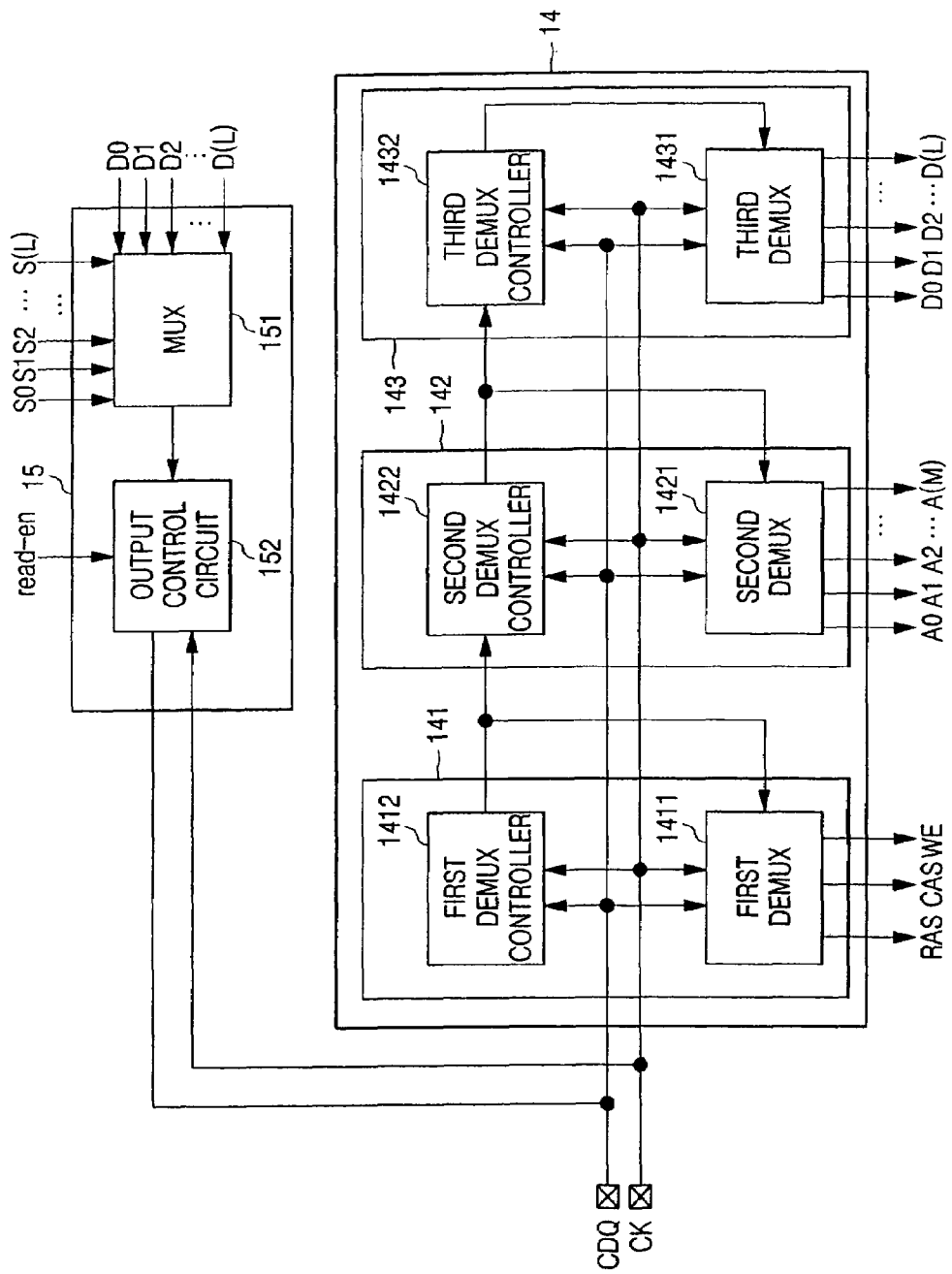
FIG. 3 is a block diagram illustrating an IO signal control circuit of the semiconductor memory device of FIG. 2.

FIG. 3 is a block diagram illustrating the IO signal control circuit 13.

As shown in FIG. 3, the IO signal control circuit 13 includes a serial to parallel converting circuit 14 and a parallel to serial converting circuit 15.

The serial to parallel converting circuit 14 includes a command serial to parallel converting circuit 141, an address serial to parallel converting circuit 142, and a data serial to parallel converting circuit 143. The command serial to parallel converting circuit 141 includes a first DEMUX 1411 and a first DEMUX controller 1412, the address serial to parallel converting circuit 142 includes a second DEMUX 1421 and a second DEMUX controller 1422, and the data serial to parallel converting circuit 143 includes a third DEMUX 1431 and a third DEMUX controller 1432. The parallel to serial converting circuit 15 includes a MUX 151 and an output control circuit 152.

Figure 4:
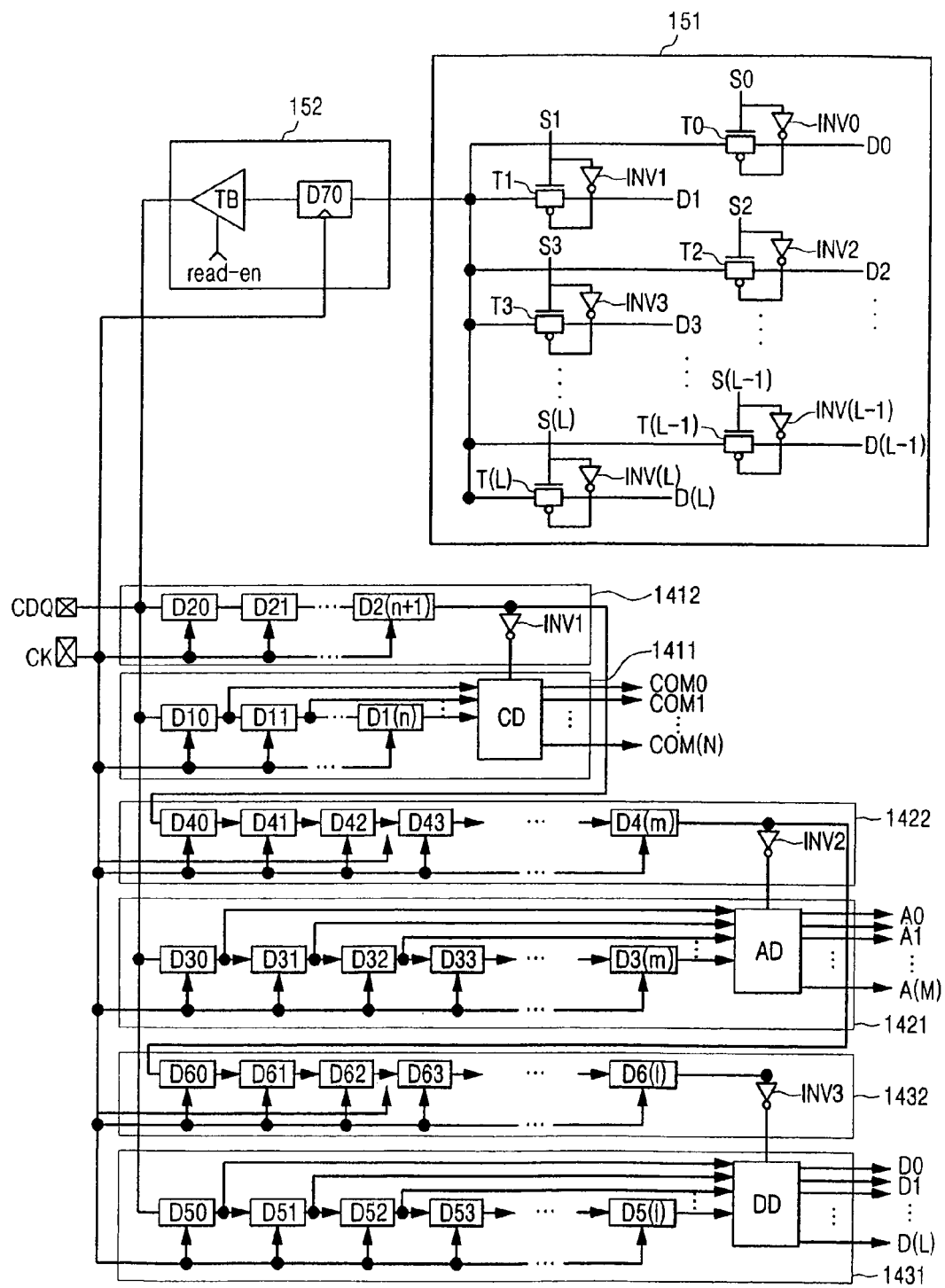
FIG. 4 is a detail circuit diagram illustrating the IO signal control circuit of FIG. 3.

FIG. 4 is a detail circuit diagram illustrating the IO signal control circuit of FIG. 3.

The first DEMUX 1411 includes as many D-flip flops D10 to D1(N) as the number(N+1) of command signals and a command signal decoder CD. A plurality of D-flip flops D10 to D1(N) latch a signal of the combined pin CDQ or front column flip flop which is located in front of itself according to the clock signal. The command signal decoder CD parallel-receives output signals of a plurality of D-flip flops D10 to D1(N) and parallel-outputs output signals of a plurality of D-flip flops D10 to D1(N) when an output enable signal out-en is received from the first DEMUX controller 1412.

The first DEMUX controller 1412 includes D-flip flops D20 to D2(N+1) which are one more in number than command signals(N+1) and an inverter INV1. A plurality of D-flip flops D20 to D2(N+1) shift a transmission starting signal to a next column D-flip flop which is located next to itself according to the clock signal. The inverter INV1 inverts the transmission starting signal, generates the output enable signal out-en and transmits it to the first DEMUX 1411 when the last D-flip flop D2(N+1) outputs the transmission starting signal.

The second DEMUX 1421 includes as many D-flip flops D30 to D3(M) as the number (M+1) of address signals and an address signal decoder AD. A plurality of D-flip flops D30 to D3(M) latch a signal of the combined pin CDQ or front column flip flop according to the clock signal. The address signal decoder AD parallel-receives output signals of a plurality of D-flip flops D30 to D3(M) and parallel-outputs output signals of a plurality of D-flip flops D30 to D3(N) when an output enable signal out-en is received from the second DEMUX controller 1422.

The second DEMUX controller 1422 includes as many D-flip flops D40 to D4(M) as the number (M+1) of address signals and an inverter INV2. A plurality of D-flip flops D40 to (M) shift the transmission starting signal to a next column D-flip flop according to the clock signal. The inverter INV2 inverts the transmission starting signal, generates the output enable signal out-en and transmits it to the second DEMUX 1421 when the last D-flip flop (M) outputs the transmission starting signal.

The third DEMUX 1431 includes as many D-flip flops D50 to D5(L) as the number (L+1) of data and a data decoder DD. A plurality of D-flip flops D50 to D5(L) latch a signal of the combined pin CDQ or front column flip flop according to the clock signal. The data decoder DD parallel-receives output signals of a plurality of D-flip flops D50 to D5(L) and parallel-outputs output signals of a plurality of D-flip flops D50 to D5(L) when an output enable signal out-en is received from the third DEMUX controller 1432.

The third DEMUX controller 1432 includes as many D-flip flops D60 to D6(L) as the number (L+1) of data and an inverter INV3. A plurality of D-flip flops D60 to D6(L) shift the transmission starting signal transmitted from the first DEMUX controller 1412 to a next column D-flip flop according to the clock signal. The inverter INV3 inverts the transmission starting signal, generates the output enable signal out-en and transmits it to the third DEMUX 1431 when the last D-flip flop D6(L) outputs the transmission starting signal.

The MUX 151 includes as many transmission gates T0 to T(L) as the number (L) of data and inverters INV1 to INV(1) which respectively correspond to the transmission gates T0 to T(L). The transmission gates T0 to T(L) receive data D0 to D(L) which are parallel-inputted from the data buffer 6 and sequentially output the data D0 to D(L) after applying different delay time to the data D0 to D(L) according to a plurality of pulse signals S0 to S7 when a plurality of pulse signals S0 to S7 having different delay times are received from the register and control circuit 3. That is, the transmission gates T0 to T(L) serial-convert data which are parallel-inputted according to a plurality of pulse signals S0 to S7.

Here, a plurality of pulse signals S0 to S7 are signals provided from the register and control circuit 3, and the register and control circuit 3 generates a first pulse signal S0 at a time point when read data determined by a CAS latency is outputted and then combines the first pulse signal S0 and the clock signal CK to generate the rest pulse signals S1 to S7 which have different delay times from each other.

The output control circuit 152 includes a D-flip flop D70 and a tri-state buffer TB. The D-flip flop D70 latches serial-converted data of the MUX 151 in response to the clock signal, and the tri-state buffer TB applies the serial-converted data outputted from the D-flip flop D70 to the combined pin CDQ only when a read operation activating signal read-en is received from the register and control circuit 3.

Here, the read operation activating signal is a signal provided from the register and control circuit 3, and the register and control circuit 3 generates the read operation activating signal when the semiconductor memory device is in read operation period in response to the command signals.

Operation of the IO signal control circuit 13 of FIGS. 2 and 3 is described below with reference to FIGS. 5A and 5B.

Figure 5A:
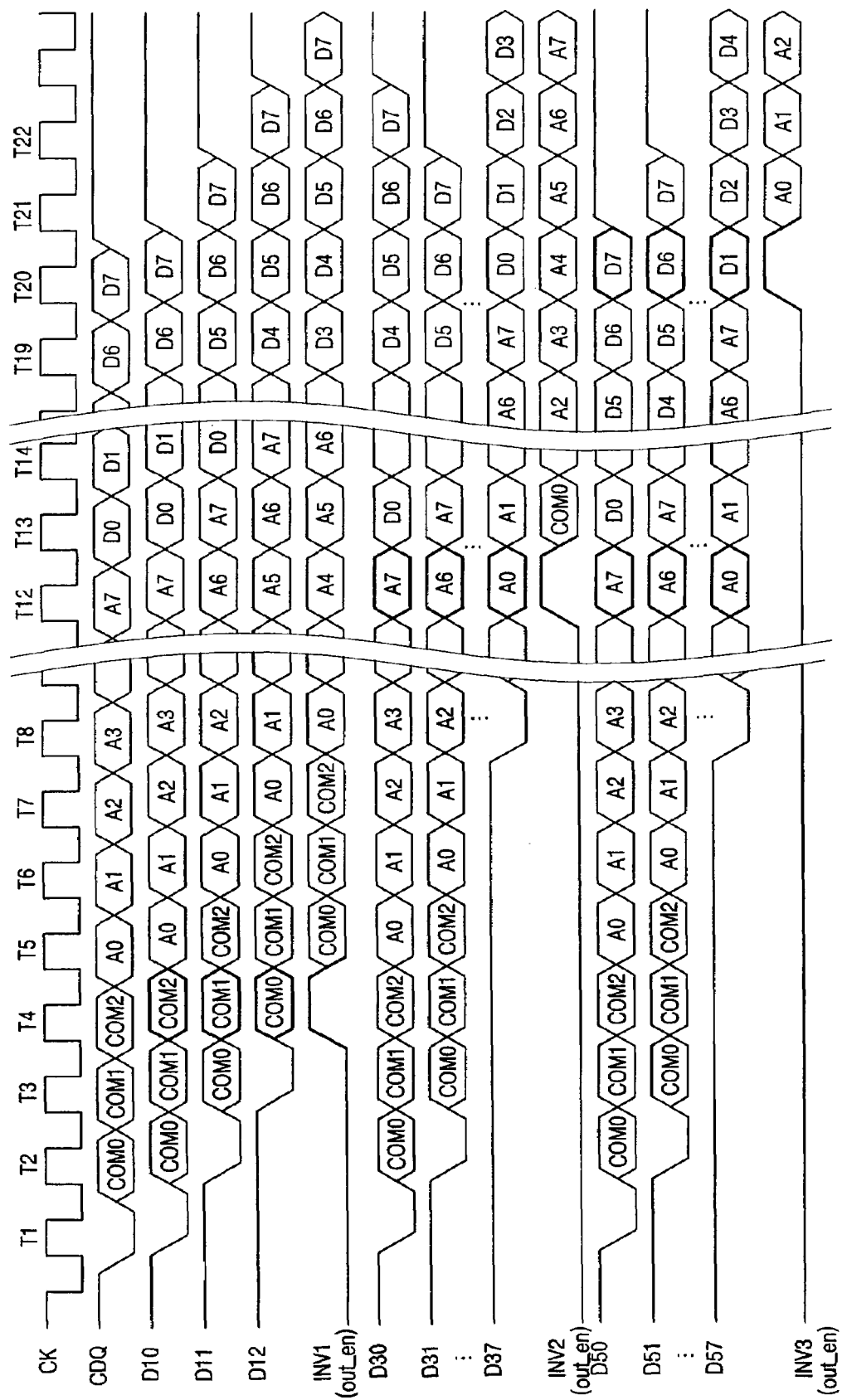
FIGS. 5A and 5B are timing diagrams illustrating signals of the IO signal control circuit of FIGS. 2 and 3.
Figure 5B:
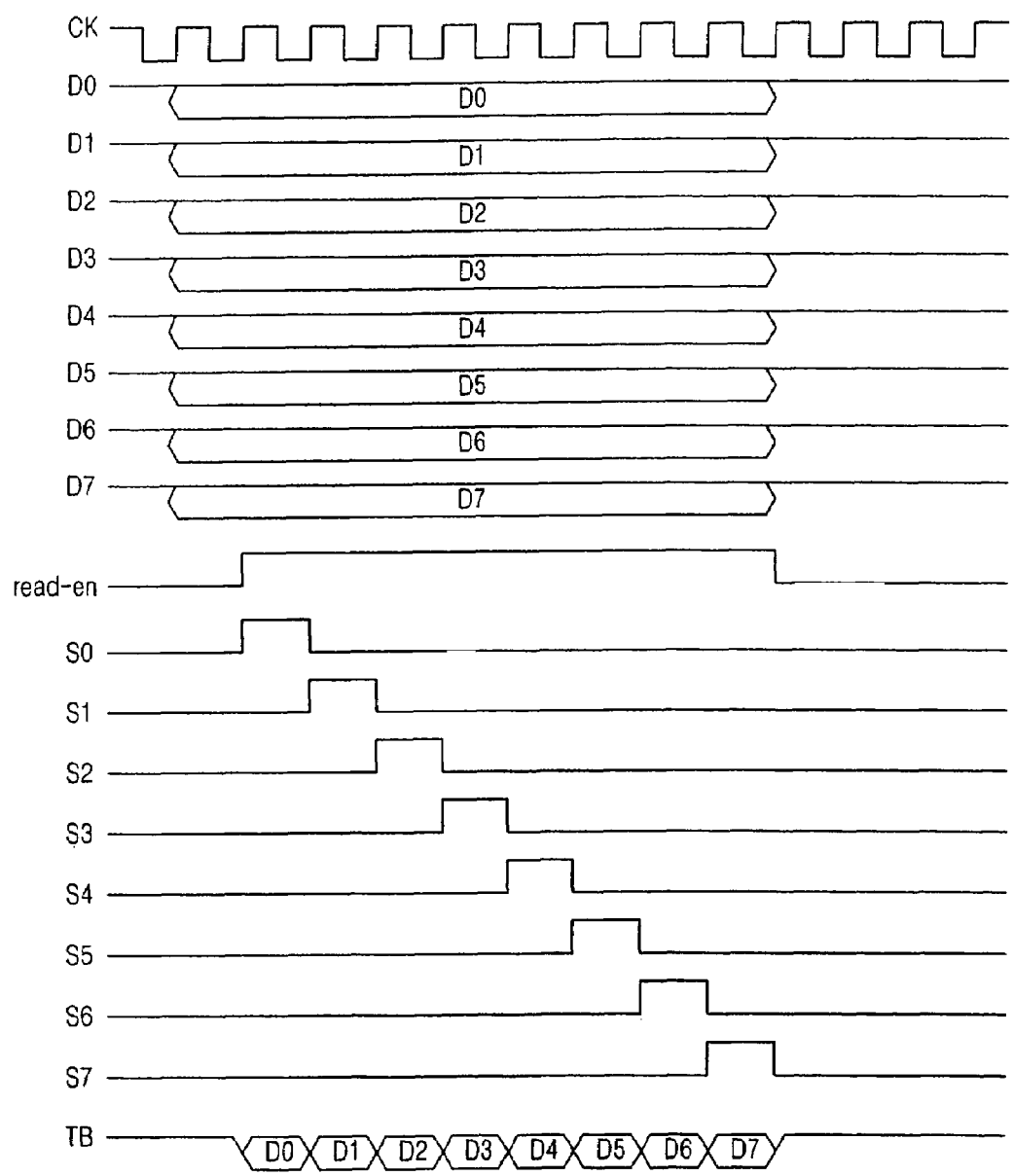

FIGS. 5A and 5B are timing diagrams illustrating signals of the IO signal control circuit of FIGS. 2 and 3.

For purposes of this description, it is assumed that the semiconductor memory device has 3 command signals COM[2:0], 8 address signals A[7:0], and 8 data D[7:0] and pins of the semiconductor memory device are terminated, to a voltage level VDD, i.e., high level, respectively.

The serialized signal CDQ has the transmission starting signal for indicating whether to start transmission, and the transmission starting signal has a low level in consideration of the fact that the pins of the semiconductor memory devices are terminated to a high level.

Operation of the IO signal control circuit 13 when the serialized signal is inputted through the combined pin CDQ is described below with reference to FIG. 5A.

If the serialized signal is not transmitted through the combined pin CDQ, at a time point before a time point T1 that a voltage level of the combined pin CDQ maintains a high level, the first to third DEMUX controller 1412 to 1432 do not generate the output enable signal by the pin terminated to a high level. Thus, the first to third DEMUX 1411 to 1431 do not generate the output signals.

At the time point T1, if the transmission starting signal PS having a low level is applied through the combined pin CDQ, a $20^{th}$ flip flop D20 of the first DEMUX controller 1412 latches the transmission starting signal PS, and first column D-flip flops D10, D30, and D50 which are located in the first column to the combined pin CDQ latch the transmission starting signal PS respectively.

At the time point T2, if a first command signal COM0 is applied through the combined pin CDQ, a $21^{st}$ flip flop D21 of the first DEMUX controller 1412 latches the transmission starting signal PS which is an output signal of the $20^{th}$ flip flop D20, and the first column D-flip flops D10, D30, and D50 which are located in the first column to the combined pin CDQ latch the first command signal COM0, respectively.

At the time point T3, if a second command signal COM1 is applied through the combined pin CDQ, a $22^{nd}$ flip flop D22 of the first DEMUX controller 1412 latches the transmission starting signal PS which is an output signal of the $21^{st}$ flip flop D21, and the first column D-flip flops D 10, D30, and D50 which are located in the first column to the combined pin CDQ latch the second command signal COM1, respectively, and the second column D-flip flops D11, D31, and D51 latch the first command signal COM0, respectively.

At the time point T4, if a third command signal COM2 is applied through the combined pin CDQ, a $23^{rd}$ flip flop D22 of the first DEMUX controller 1412 latches the transmission starting signal PS which is an output signal of the $22^{nd}$ flip flop D22, and the first column D-flip flops D10, D30, and D50 which are located in the first column to the combined pin CDQ latch the third command signal COM2, respectively, the second column D-flip flops D1, D31, and D51 latch the second command signal COM1, respectively, and third column D-flip flops D12, D32, and D52 latch the first command signal COM0, respectively.

The first inverter INV1 inverts the latched transmission starting signal PS of the fourth flip flop D23 to generate the output enable signal out-en, and the command decoder CD parallel-outputs the output signals COM2, COM1, and COM0 of $10^{th}$ to $12^{th}$ D-flip flops D10, D11 and D12 in response to this.

At the time point T5, if a first address signal A0 is applied through the combined pin CDQ, a $30^{th}$ flip flop D20 of the second DEMUX controller 1422 latches the transmission starting signal PS which is an output signal of the $23^{rd}$ flip flop D23 of the first DEMUX control signal 1412, and the first column D-flip flops D10, D30, and D50 which are located in the first column to the combined pin CDQ latch the first address signal A0, respectively, the second column D-flip flops D11, D31, and D51 latch the third command signal COM2, respectively, and the third column D-flip flops D12, D32, and D52 latch the second command signal COM1, respectively, and fourth column D-flip flops D33 and D53 latch the first command signal COM0, respectively.

As the clock signal is applied as described above, the first to third DEMUX controllers 1412 to 1432 shift the transmission starting signal, the D-flip flops of the first to third DEMUX 1411 to 1431 which are serially connected to the combined pin CDQ latch a signal of the combined pin CDQ or front column D-flip flip.

At a time pint T14 after a predetermined time period lapses, a $47^{th}$ flip flop D47 of the second DEMUX controller 1422 latches the transmission starting signal PS, the second inverter INV2 generates the output enable signal out-en, and the command decoder CD parallel-outputs first to eighth address signals A0 to A7 which are respectively latched by $30^{th}$ to $37^{th}$ D-flip flops D30 to D37 according to the output enable signal out-en.

At a time pint T22, a $67^{th}$ flip flop D67 of the third DEMUX controller 1432 latches the transmission starting signal PS, the third inverter INV3 generates the output enable signal out-en, and the data decoder DD parallel-outputs first to eighth data D0 to D7 which are respectively latched by $50^{th}$ to $57^{th}$ D-flip flops D50 to D57 according to the output enable signal out-en.

As described above, the IO signal control circuit 13 parallel-converts and outputs the serialized signals inputted through the combined pin CDQ.

Operation of the IO signal control circuit 13 when data are parallel-inputted from the data buffer 6 is described below with reference to FIG. 5B.

The register and control circuit 3 generates 8 pulse signals S0 to S7 having different delay times and the read operation activating signal read-en and provides them to the IO signal control circuit 13, and when the data buffer 6 parallel-outputs data due to operation of the internal circuit 11, respective data are applied to drains of a plurality of transmission gates T0 to T7 of the MUX 151.

If the first pulse signal S0 is enabled, the first transmission gate T0 transmits a first data D0 in response to the first pulse signal S0, and a $70^{th}$ flip flop D70 latches the first data D0 according to the clock signal, and the tri-state buffer TB outputs the first data D0 to the combined pin CDQ.

If the second pulse signal S1 is enabled, the second transmission gate T1 transmits a second data D1 in response to the second pulse signal S1, and the $70^{th}$ flip flop D70 latches the second data D1 according to the clock signal, and the tri-state buffer TB outputs the second data D1 to the combined pin CDQ.

If the third pulse signal S2 is enabled, the third transmission gate T2 transmits a third data D2 in response to the third pulse signal S2, and the $70^{th}$ flip flop D70 latches the third data D2 according to the clock signal, and the tri-state buffer TB outputs the third data D2 to the combined pin CDQ.

The MUX 151 outputs a fourth data D3 when a fourth pulse signal S3 is applied, a fifth data D4 when a fifth pulse signal S4 is applied, a sixth data D5 when a sixth pulse signal S5 is applied, a seventh data D6 when a seventh pulse signal S6 is applied, and an eighth data D7 when an eight pulse signal S7 is applied. Thus, parallel data D0 to D7 applied to the MUX 151 are serially converted, and the tri-state buffer TB outputs the serial-converted data D0 to D7 to the combined pin CDQ.

As described above, the semiconductor memory device has one combined pin CDQ and the IO signal control circuit 13 and thus receives/outputs a plurality of command signals, address signals and data through the combined pin CDQ without changing the internal circuit.

However, since the semiconductor memory device serially transmits the command signals, the address signals and the data using one combined pin, an access time and command cycle time of the semiconductor memory device are increased.

Described below is a semiconductor memory device which supports a quadrature data rate QDR or octal data rate ODR to reduce the access time and the command cycle time.

Figure 6:
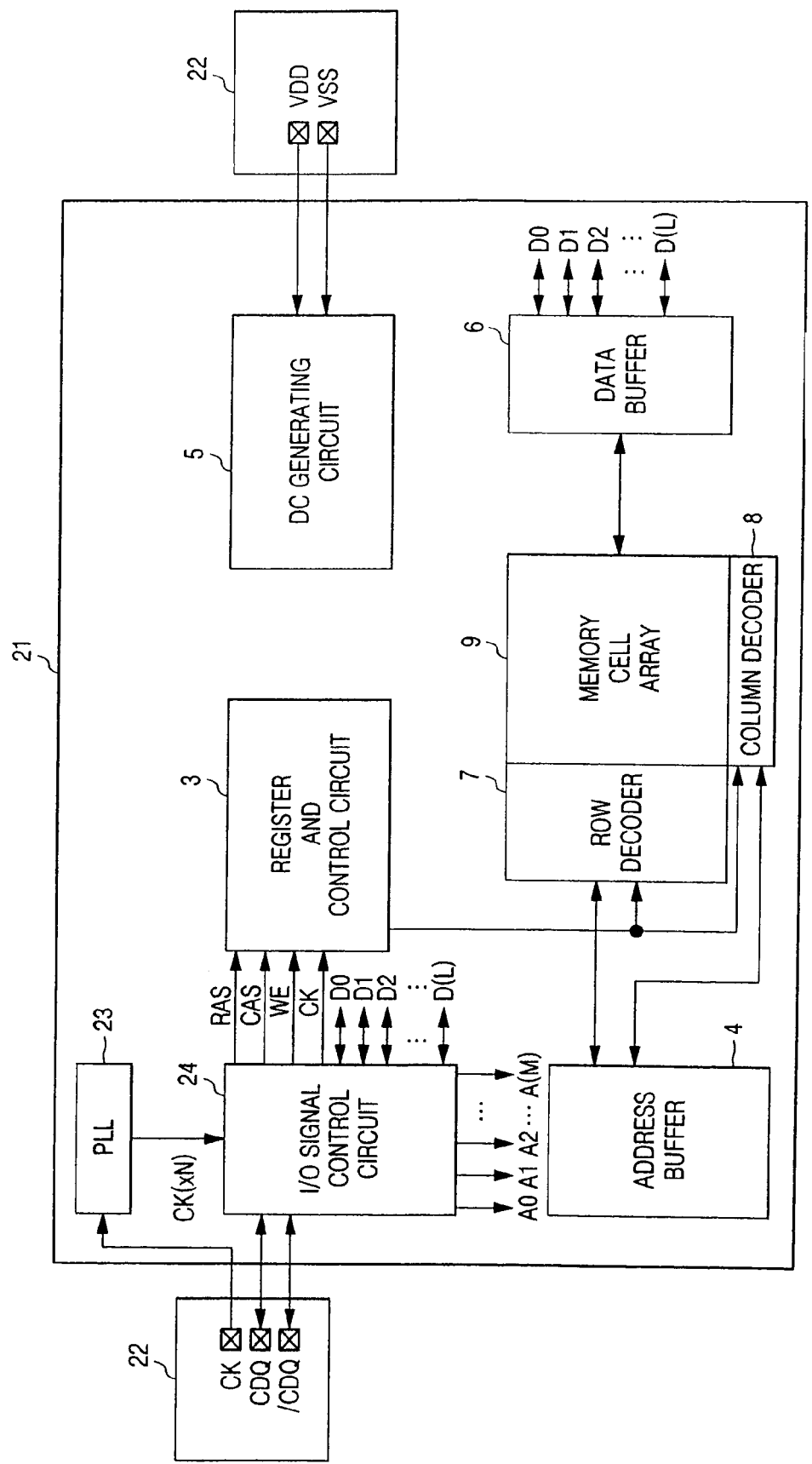
FIG. 6 is a block diagram illustrating a semiconductor memory device according to a second embodiment of the present invention.

FIG. 6 is a block diagram illustrating a semiconductor memory device according to a second embodiment of the present invention. The semiconductor memory device of FIG. 6 includes an internal circuit 21 and a plurality of pins 22. The internal circuit 21 includes a register and control circuit 3, an address buffer 4, a DC generating circuit 5, a data buffer 6, a row decoder 7, a column decoder 8, a memory cell array 9, and a phase locked loop PLL 23. In the embodiment of FIG. 6, the IO signal control circuit 13 of the previously described embodiment is replaced with an IO signal control circuit 24.

A plurality of pins 22 include a combined pin CDQ for a non-inverted signal which receives or outputs a non-inverted signal CDQ of a serialized signal, i.e., a non-inverted serial signal, a combined pin /CDQ for an inverted signal which receives or outputs an inverted signal of the serialized signal /CDQ, i.e., an inverted serialized signal, a clock pin CK to which the clock signal CK is applied, and a power pin VDD to which the power voltage VDD is applied, and a ground pin VSS to which the ground voltage VSS is applied. Thus, the serialized signal CDQ is inputted or outputted as a differential signal type, i.e., serialized signal pair CDQ,/CDQ through the combined pin CDQ for the non-inverted signal and the combined pin for non-inverted signal.

Like reference numerals of FIGS. 2 and 6 denote like parts and perform like operations, and thus description of those parts will not be repeated.

Figure 7:
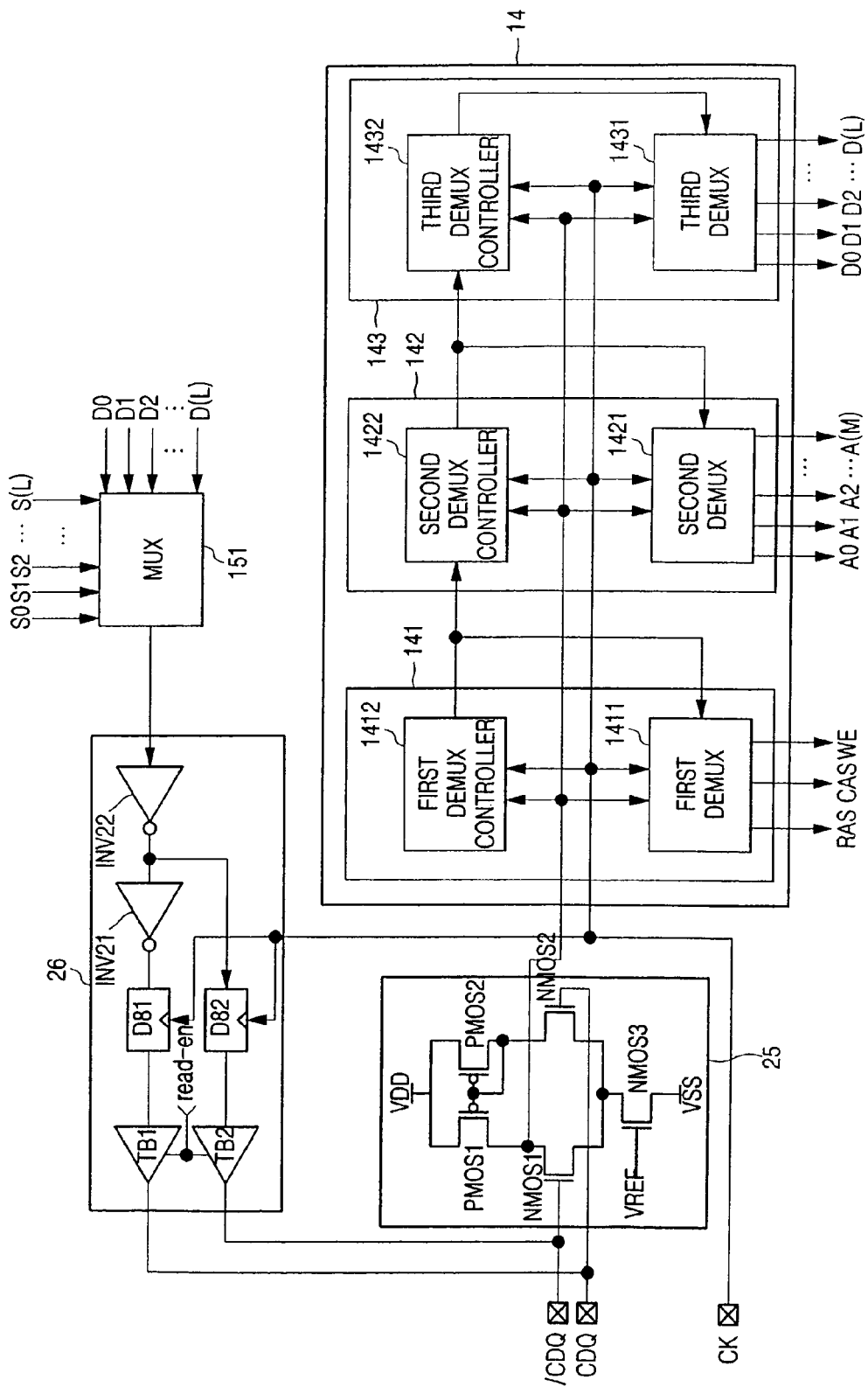
FIG. 7 is a block diagram illustrating an IO signal control circuit of the semiconductor memory device of FIG. 6.

FIG. 7 is a block diagram illustrating an IO signal control circuit 24 of the semiconductor memory device of FIG. 6.

The IO signal control circuit 24 of FIG. 7 further includes an input signal acquiring circuit 25 in addition to the serial to parallel converting circuit 14 and the parallel to serial converting circuit 15, and the output control circuit 152 of the parallel to serial converting circuit 15 of the previously described embodiment is replaced with an output control circuit 26.

Functions of the PLL 23, the input signal acquiring circuit 25, and the output control circuit 26 of FIG. 7 are described below.

The PLL 23 is connected to a clock pin CK to which a clock signal CK is inputted to multiply and output a frequency of the clock signal CK. The internal circuit of the semiconductor memory device performs a write operation or read operation according to the multiplied clock signal. If the PLL 23 multiplies the clock signal by four times, the semiconductor memory device receives or outputs the serialized signal at a QDR rate, and if the PLL 23 multiplies the clock signal by eight times, the semiconductor memory device receives or outputs the serialized signal at a ODR rate.

The PLL 23, which multiplies the frequency of the clock signal, is well-known to ordinary skilled persons in the art and, thus detailed description of it is omitted.

The input signal acquiring circuit 25 includes a differential amplifier which has two PMOS transistors PMOS1 and PMOS2 and three NMOS transistors NMOS1 to NMOS3, and compares a voltage level of the inverted serialized signal /CDQ to a voltage level of the non-inverted serialized signal CDQ and outputs the comparison result as the serialized signal CDQ.

The output control circuit 26 includes two inverters INV21 and INV22 which are serially connected to the MUX 151, and two D-flip flops D81 and D82 and two tri-state buffers TB1 and TB2 which correspond to the inverter INV21 and INV22, respectively. The two inverters INV21 and INV22 generate the serialized signal pair CDQ,/CDQ and latch the serialized signal pair CDQ,/CDQ according to the clock signal CK.

The two tri-state buffers TB1 and TB2 respectively apply the serialized signal pair CDQ,/CDQ of the D-flip flops D81 and D82 to the combined pin CDQ for the non-inverted signal and the combined pin /CDQ for the inverted signal only when the read operation activating signal read-en is received from the register and control circuit 3.

If the serialized signal pair is transmitted through the combined pin CDQ for the non-inverted signal and the combined pin /CDQ for the inverted signal, the IO signal control circuit 24 of the semiconductor memory device of FIGS. 6 and 7 acquires only the serialized signal CDQ through the input signal acquiring circuit 25 and then applies it to the serial to parallel converting circuit 14.

The serial to parallel converting circuit 14 operates the same way as that described in connection with FIG. 3 to detect input of the serialized signal, parallel-converts the command signals, the address signals and data and then parallel-inputs the command signals to the register and control circuit 3, the address signals to the address buffer 4, and the data to the data buffer 6.

The MUX 151 receives the parallel data from the data buffer 6 and operates the same way as that described in connection with FIG. 3 to serial-convert the parallel data to generate the serialized signals. The output control circuit 26 converts the serialized signals to the serialized signal pair and then outputs the inverted signal /CDQ to the combined pin /CDQ for the inverted signal and the serialized signal CDQ to the combined pin CDQ for the non-inverted signal.

The semiconductor memory device of FIGS. 6 and 7 receives or outputs the serialized signal CDQ as a differential signal type, i.e., a serialized signal pair CDQ,/CDQ and thus prevents signal errors which may occur as the data transmission rate of the semiconductor memory device is faster in advance.

Figure 8:
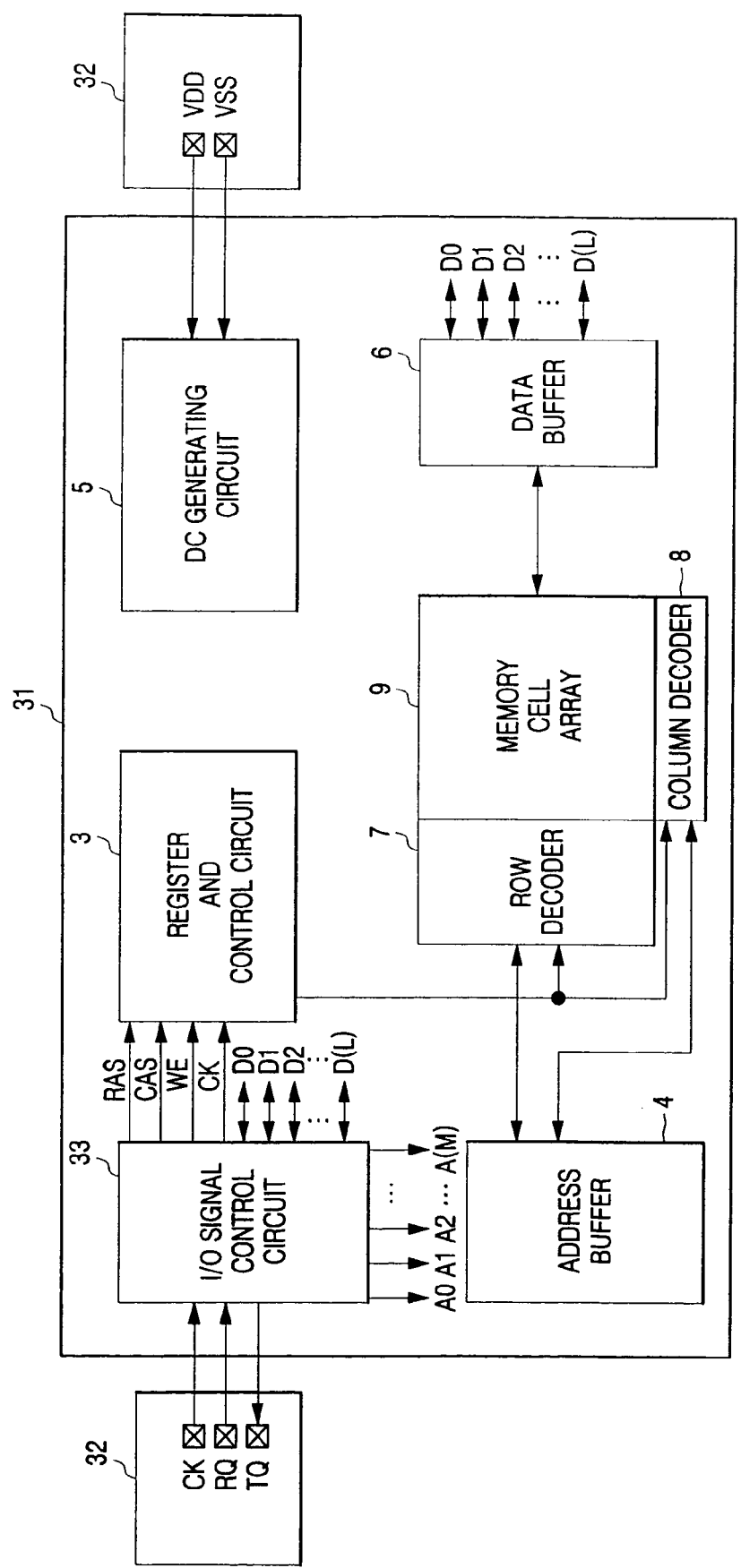
FIG. 8 is a block diagram illustrating a semiconductor memory device according to a third embodiment of the present invention.

FIG. 8 is a block diagram illustrating a semiconductor memory device according to a third embodiment of the present invention.

The semiconductor memory device of FIG. 8 includes an internal circuit 31 and a plurality of pins 32. The internal circuit 31 includes a register and control circuit 3, an address buffer 4, a DC generating circuit 5, a data buffer 6, a row decoder 7, a column decoder 8, and a memory cell array 9, and, in the embodiment of FIG. 8, the IO signal control circuit 13 of FIG. 2 is replaced with an IO signal control circuit 33.

A plurality of pins 32 include a receiving combined pin RQ for receiving a serialized signal RQ, a transmitting combined pin TQ for transmitting the serialized signal TQ, a clock pin CK to which the clock signal CK is applied, and a power pin VDD to which the power voltage VDD is applied, and a ground pin VSS to which the ground voltage VSS is applied.

Like reference numerals of FIGS. 2 and 8 denote like parts and perform like operations, and thus description of those parts will not be repeated.

Figure 9:
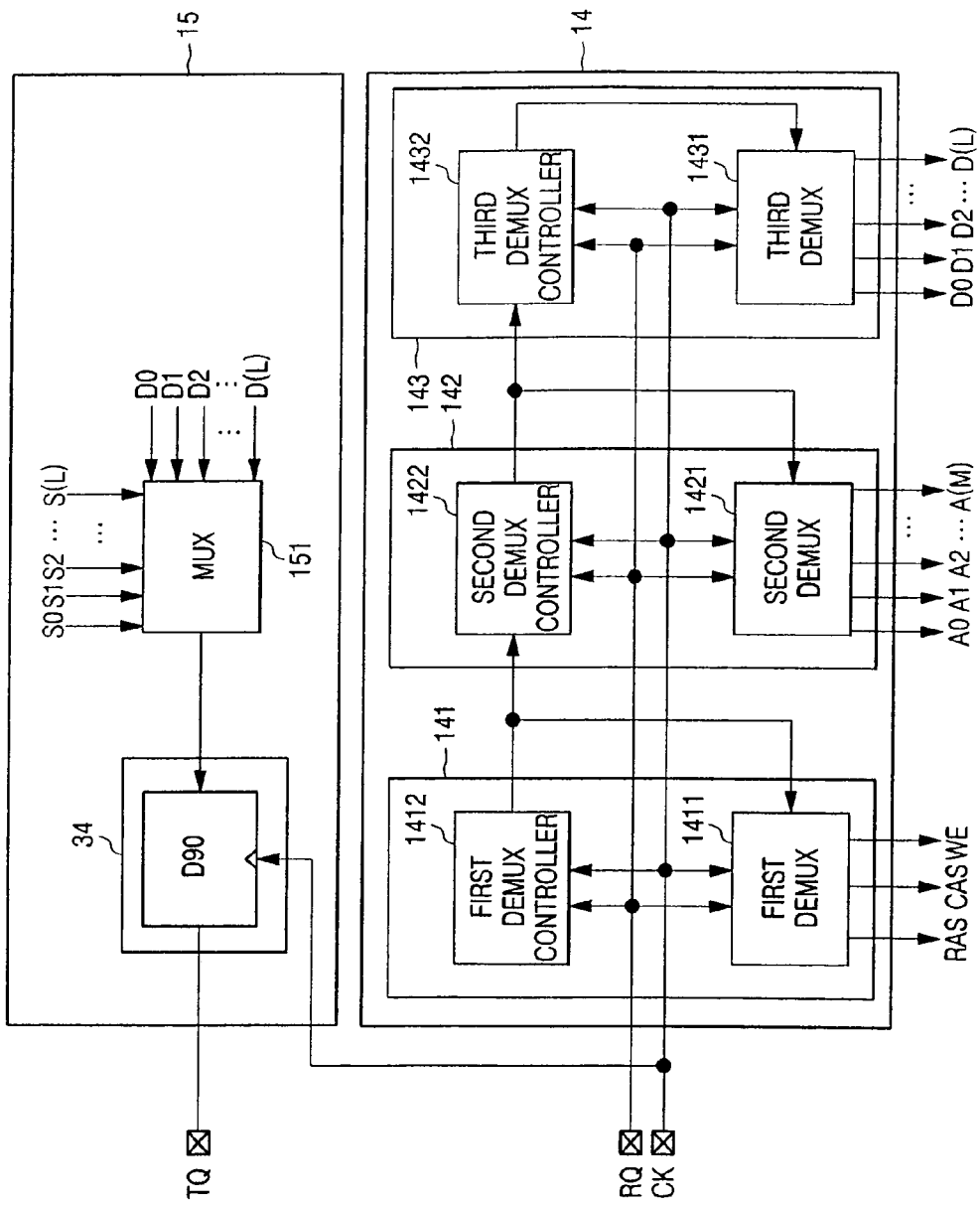
FIG. 9 is a block diagram illustrating an IO signal control circuit of the semiconductor memory device of FIG. 8.

FIG. 9 is a block diagram illustrating an IO signal control circuit 33 of the semiconductor memory device of FIG. 8.

The IO signal control circuit 33 of FIG. 9 includes the serial to parallel converting circuit 14 and the parallel to serial converting circuit 15 of FIG. 2, and the output control circuit 152 of the parallel to serial converting circuit 15 of FIG. 2 is replaced with an output control circuit 34. The receiving combined pin RQ is connected to the serial to parallel converting circuit 14, and the transmitting combined pin TQ is connected to the parallel to serial converting circuit 15, and the receiving combined pin RQ and the transmitting combined pin RQ are electrically isolated.

The output control circuit 34 includes a D-flip flop D90, and the D-flip flop D90 latches the serial-converted data of the MUX 151 in response to the clock signal CK and applies the latched data to the transmitting combined pin TQ.

In the semiconductor memory device of FIG. 9, if the serialized signals are applied to the receiving combined pin RQ, the serial to parallel converting circuit 14 of the IO signal control circuit 24 operates the same way as that described in connection with FIG. 3 to detect input the serialized signals, parallel-convert the command signals, the address signals and data and then parallel-input them to the register and control circuit 3, the address buffer 4 and the data buffer 6.

The MUX 151 receives the parallel data from the data buffer 6 and operates the same way as that described in connection with FIG. 3 to serial-convert the parallel data, and the output control circuit 34 applies the serial-converted data to the transmitting combined pin TQ according to the clock signal CK.

The semiconductor memory device of FIGS. 8 and 9 electrically isolates the pin for receiving the serialized signal, i.e., command signals, address signals and data and the pin for outputting serialized read data.

Thus, the semiconductor memory device can output the serialized command signals and address signals through the transmitting combined pin while receiving new serialized command signals and address signals through the receiving combined pin, whereby transmission efficiency of control signals and data is improved.

Figure 10:
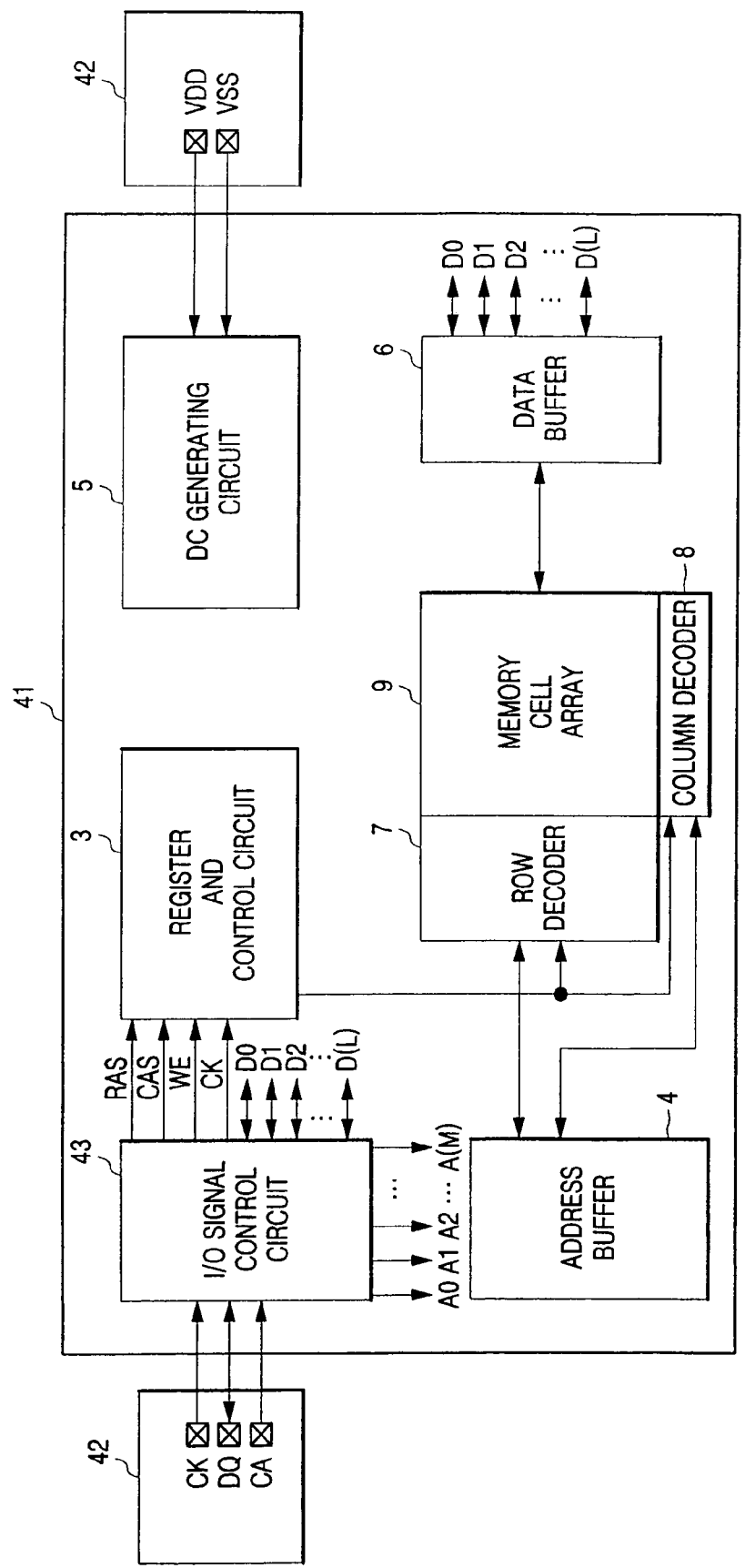
FIG. 10 is a block diagram illustrating a semiconductor memory device according to a fourth embodiment of the present invention.

FIG. 10 is a block diagram illustrating a semiconductor memory device according to a fourth embodiment of the present invention.

The semiconductor memory device of FIG. 10 includes an internal circuit 41 and a plurality of pins 42. The internal circuit 41 includes a register and control circuit 3, an address buffer 4, a DC generating circuit 5, a data buffer 6, a row decoder 7, a column decoder 8, and a memory cell array 9, and the IO signal control circuit 13 of FIG. 2 is replaced with an IO signal control circuit 43.

A plurality of pins 42 include a combined pin CA for a control signal which receives or outputs serialized signals CA including serialized command signals and address signals, a combined pin DQ for data which receives or outputs serialized signals DQ including serialized data, a clock pin CK to which the clock signal CK is applied, and a power pin VDD to which the power voltage VDD is applied, and a ground pin VSS to which the ground voltage VSS is applied.

Like reference numerals of FIGS. 2 and 10 denote like parts and perform like operations, and thus description of those parts will not be repeated.

Figure 11:
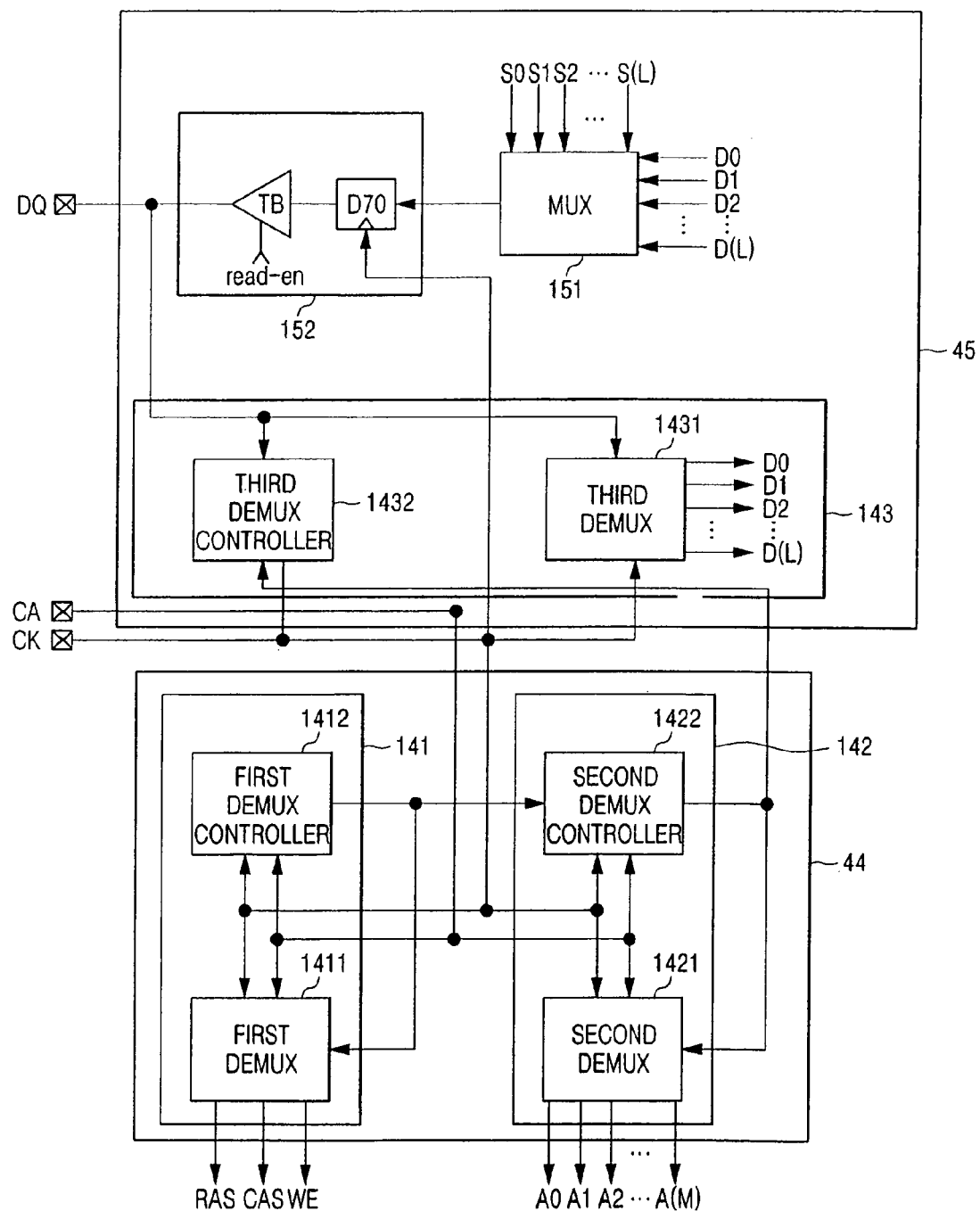
FIG. 11 is a block diagram illustrating an IO signal control circuit of the semiconductor memory device of FIG. 10.

FIG. 11 is a block diagram illustrating the IO signal control circuit 43.

The IO signal control circuit 43 of FIG. 10 includes the command serial to parallel converting circuit 141 and the address serial to parallel converting circuit 142 of FIG. 2, and a serial and parallel converting circuit 45 includes a MUX 151, an output control circuit 152, and a data serial to parallel converting circuit 143 of FIG. 2.

In the semiconductor memory device of FIG. 11, if the serialized signals including the serialized command signals and address signals are applied through the combined pin CA for control signal, the command serial to parallel converting circuit 141 and the address serial to parallel converting circuit 142 of the serial converting circuit 44 of the IO signal control circuit 43 operates the same way as that described in connection with FIG. 3 to parallel-convert the serialized signals to command signals and address signals and applies them to the register and command circuit 3 and the address buffer 4.

If the serialized signals DQ having data are applied through the combined pin DQ for data after the serialized signals CA having the command signals and address signals, the serial to parallel converting circuit 143 of the serial and parallel converting circuit 45 operates the same way as that described in connection with FIG. 3 to parallel convert the serialized data and input them to the data buffer 6.

If the parallel data are applied from the data buffer 6, the serial and converting circuit 45 operates the MUX 151 and the output control circuit 152 the same way as described in connection with FIG. 3 to serial convert the parallel data and apply them to the combined pin D0 for data.

As described above, the semiconductor memory device of FIGS. 10 and 11 includes the pin for receiving the serialized signals having the serialized command signals and address signals and the pin DQ for receiving or outputting the serialized data which are electrically isolated.

Thus, the semiconductor memory device of FIGS. 10 and 11 allows the combined pin CA for control signal to receive the command signals and the address signals which are continuously serialized. That is, the semiconductor memory device can perform a read operation continuously after write operation or perform continuous read or write operation.

The above embodiments have been described focusing on a case where the clock signal CK is applied from an external portion outside the semiconductor memory device.

FIGS. 12 and 13 show that a clock data recovering circuit which is universally being used is employed to acquire the clock signal from the serialized signals.

FIG. 12 is a block diagram illustrating a semiconductor memory device according to a fifth embodiment of the present invention.

The semiconductor memory device of FIG. 12 includes an internal circuit 51 and a-plurality of pins 52. The internal circuit 51 includes a register and control circuit 3, an address buffer 4, a DC generating circuit 5, a data buffer 6, a row decoder 7, a column decoder 8, and a memory cell array 9 of FIG. 2, and the IO signal control circuit 13 of FIG. 2 is replaced with an IO signal control circuit 53.

A plurality of pins 52 include a combined pin Z which receives or outputs serialized signals Z including serialized command signals, address signals and data, and a power pin VDD to which the power voltage VDD is applied, and a ground pin VSS to which the ground voltage VSS is applied.

Like reference numerals of FIGS. 2 and 12 denote like parts and perform like operations, and thus description of those parts will not be repeated.

FIG. 13 is a block diagram illustrating the IO signal control circuit 53 of FIG. 12.

The IO signal control circuit 53 of FIG. 13 further includes a clock data recovery circuit 54 in addition to the serial to parallel converting circuit 14 and the parallel to serial converting circuit 15 of FIG. 2.

The clock data recovery circuit 54 receives a signal inputted through the combined pin Z and generates the clock signal CK required by the internal circuit 51 by using a data toggling edge method. Here, the clock data recovery circuit is well-known to the ordinarily skilled person in the art and, thus description of it is omitted.

If the serialized signals Z are applied through the combined pin Z, the IO signal control circuit 43 of the semiconductor memory device of FIG. 13 generates the clock signal CK through the clock data recovery circuit 54, and the serial converting circuit 14 operates the same way as described in connection with FIG. 3 to parallel convert the serialized signals Z to the command signals, the address signals, and data and parallel output them to the register and command circuit 3, the address buffer 4, and the data buffer 6.

If the parallel data are received from the data buffer 6, the parallel to serial converting circuit 15 operates the same way as described in connection with FIG. 3 to serialize the parallel data and apply them to the combined pin Z.

As descried above, the semiconductor memory device of FIGS. 12 and 13 can reduce the number of pins because the clock pin CK is not necessary.

As described herein, the semiconductor memory device of the present invention has the command signals, the address signals and data which are serialized to input or output through one pin and significantly reduces the number of pins. Thus, packaging size of the semiconductor memory device is reduced, and the number of pins to space area is broadened, whereby packaging is improved.

In addition, since the number of pins is reduced, the electrical current consumed by the pins is reduced. Thus, chip temperature of the semiconductor memory device goes down, and power consumption of the semiconductor memory device is reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor memory device, comprising:
an IO circuit for receiving or outputting command signals, address signals and data which are serialized, wherein the IO circuit includes:
  a combined terminal receiving or outputting the command signals, the address signals, and the data which are serialized; and
an IO signal control circuit for parallel converting the serialized command signals, address signals and data inputted through the IO circuit and applying the parallel converted signals to an internal circuit, and serial converting parallel data applied from the internal circuit and outputting the serial converted signals to the IO circuit, wherein the IO signal control circuit includes:
  a serial to parallel converting portion for parallel converting the serialized command signals, address signals and data inputted through the IO circuit and applying the parallel converted signals to the internal circuit, wherein the serial to parallel converting portion includes:
    a command signal serial to parallel converting portion for acquiring and parallel converting the serialized command signals among the serialized command signals, address signals and data inputted through the IO circuit and applying the parallel converted command signals to the internal circuit;
    an address signal serial to parallel converting portion for acquiring and parallel converting the serialized address signals among the serialized command signals, address signals and data inputted through the IO circuit and applying the parallel converted address signals to the internal circuit; and
    a data serial to parallel converting portion for acquiring and parallel converting the serialized data among the serialized command signals, address signals and data inputted through the IO circuit and applying the parallel converted data to the internal circuit.

2. The device of claim 1, wherein the command signal serial to parallel converting portion includes:
   a first DEMUX for receiving and parallel converting a predetermined bit signal corresponding to the number of the command signals; and
   a first DEMUX control portion for activating operation of the first DEMUX if the first DEMUX detects input of the predetermined bit signal having the command signals.

3. The device of claim 1, wherein the address signal serial to parallel converting portion includes:
   a second DEMUX for receiving and parallel converting a predetermined bit signal corresponding to the number of the address signals; and
   a second DEMUX control portion for activating operation of the second DEMUX if the second DEMUX detects input of the predetermined bit signal having the address signals.

4. The device of claim 1, wherein the data serial to parallel converting portion includes:
   a third DEMUX for receiving and parallel converting a predetermined bit signal corresponding to the number of the address signals; and
   a third DEMUX control portion for activating operation of the third DEMUX if the third DEMUX detects input of the predetermined bit signal having the data.

5. The device of claim 1, wherein the IO circuit further comprises:
   a clock terminal receiving a clock signal.

6. The device of claim 5, wherein the IO signal control circuit further comprises:
   a parallel to serial converting portion for serial converting parallel data applied from the internal circuit and outputting the serial converted signals to the IO circuit.

7. The device of claim 6, wherein the parallel to serial converting portion includes a MUX for serial converting data parallel-inputted from the internal circuit.

8. The device of claim 7, wherein the parallel to serial converting portion further includes an output control portion which receives an output signal of the MUX and outputs the output signal of the MUX to the IO circuit only when the semiconductor memory device performs a read operation.

9. The device of claim 1, wherein the IO circuit includes first and second combined terminals and a clock terminal, the first combined terminal receives the serialized command signals, address signals and data, and the second combined terminal outputs the serialized data, and the clock terminal receives a clock signal.

10. The device of claim 9, wherein the IO signal control circuit includes:
    a serial to parallel converting portion for parallel converting the serialized command signals, address signals and data inputted through the first combined terminal and applying the parallel converted signals to the internal circuit; and
    a parallel to serial converting portion for serial converting parallel data applied from the internal circuit and outputting the serial converted data to the second combined terminal.

11. The device of claim 10, wherein the serial to parallel converting portion includes:
    a command signal serial to parallel converting portion for acquiring and parallel converting the serialized command signals among the serialized command signals, address signals and data inputted through the first combined terminal and applying the parallel converted command signals to the internal circuit;
    an address signal serial to parallel converting portion for acquiring and parallel converting the serialized address signals among the serialized command signals, address signals and data inputted through the first combined terminal and applying the parallel converted address signals to the internal circuit; and
    a data serial serial to parallel converting portion acquiring and parallel converting the serialized data among the serialized command signals, address signals and data inputted through the first combined terminal and applying the parallel converted data to the internal circuit.

12. The device of claim 1, wherein the IO circuit includes first and second combined terminals and a clock terminal, the first combined terminal receives the serialized command signals and address signals, and the second combined terminal outputs the serialized data, and the clock terminal receives a clock signal.

13. The device of claim 12, wherein the IO signal control circuit includes:
    a serial to parallel converting portion for parallel converting the serialized command signals and address signals inputted through the first combined terminal and applying the parallel converted command signals and address signals to the internal circuit; and
    a serial and parallel converting portion for parallel converting parallel data applied through the second combined terminal and applying the parallel converted data to the internal circuit, and serial converting data inputted from the internal circuit and outputting the serial converted data to the second combined terminal.

14. The device of claim 13, wherein the serial to parallel converting portion includes:
    a command signal serial to parallel converting portion for acquiring and parallel converting the serialized command signals among the serialized command signals, address signals and data inputted through the first combined terminal and applying the parallel converted command signals to the internal circuit; and
    an address signal serial to parallel converting portion for acquiring and parallel converting the serialized address signals among the serialized command signals, address signals and data inputted through the first combined terminal and applying the parallel converted address signals to the internal circuit.

15. The device of claim 13, wherein the serial and parallel converting portion includes:
    a data serial to parallel converting portion for acquiring and parallel converting the serialized data among the serialized command signals, address signals and data inputted through the second combined terminal; and
    a data parallel to serial converting portion for serial converting data parallel-inputted from the internal circuit.

16. The device of claim 1, wherein the IO circuit includes:
    two combined terminals and a clock terminal, the two combined terminals receiving or outputting command signal pairs, address signal pairs and data pair which are serialized, the clock terminal receiving a clock signal.

17. The device of claim 16, wherein the IO signal control circuit acquires and parallel converts command signals, address signals and data which are serialized and applies the parallel converted signals to an internal circuit if the serialized comand signal pairs, address signal pairs and data pair are received through the two combined terminals, and converts parallel data inputted from the internal circuit to a serialized data pair and outputs the serialized data pair to the two combined terminals.

18. The device of claim 17, wherein the semiconductor memory device further includes a clock converting portion for multiplying the clock signal inputted through the clock terminal and outputting the multiplied clock signal as an internal clock signal.

19. The device of claim 18, wherein the clock converting portion comprises a phase locked loop (PLL) for multiplying the clock signal.

20. The device of claim 19, wherein the IO signal control circuit includes:
- a serial to parallel converting portion for acquiring and parallel converted signals to the internal circuit if the serialized command signal pairs, address signal pairs and data pair are received through the two combined terminals; and
- a parallel to serial converting portion for converting parallel data inputted from the internal circuit to the serialized data pair and applying serialized data pair to the two combined terminals.

21. the device of claim 20, wherein the serial to parallel converting portion includes:
- a signal acquiring means for comparing voltage levels of the serialized command signal pairs, address signal pairs and data pair and acquiring serialized command signals, address signals and data having voltage level based on the comparison result;
- a command signal serial to parallel converting portion for acquiring and parallel converting the serialized command signals among the serialized command signals, address signals and data inputted through the IO circuit and applying the parallel converted command signals to the internal circuit;
- an address signal serial to parallel converting portion for acquiring and parallel converting the serialized address signals among the serialized command signals, address signals and data inputted through the IO circuit and applying the parallel converted address signals to the internal circuit; and
- a data serial to parallel converting portion acquiring and parallel converting the serialized data among the serialized command signals, address signals and data inputted through the IO circuit and applying the parallel converted data to the internal circuit.

22. The device of claim 21, wherein the command signal serial to parallel converting portion includes:
- a first DEMUX for receiving and parallel converting a predetermined bit signal corresponding to the number of the command signals; and
- a first DEMUX control portion for activating operation of the first DEMUX if the first DEMUX detects input of the predetermined bit signal having the command signals.

23. The device of claim 21, wherein the address signal serial to parallel converting portion includes:
- a second DEMUX for receiving and parallel converting a predetermined bit signal corresponding to the number of the address signals; and
- a second DEMUX control portion for activating operation of the second DEMUX if the second DEMUX detects input of the predetermined bit signal having the address signals.

24. The device of claim 21, wherein the data serial to parallel converting portion includes:
- a third DEMUX for receiving and parallel converting a predetermined bit signal corresponding to the number of the address signals, and
- a third DEMUX control portion for activating operation of the third DEMUX if the third DEMUX detects input of the predetermined bit signal having the data.

25. The device of claim 20, wherein the parallel to serial converting portion includes:
- a MUX for serial converting data parallel-inputted from the internal circuit; and
- an output control portion for converting data of the MUX to a data pair and outputting the data pair to the two combined terminals according to the multiplied clock signal.

26. The device of claim 25, wherein the output control portion further has a function for outputting the data pair to the two combined terminals only when the semiconductor memory device performs read operation.

27. The device of claim 1, wherein the semiconductor memory device further includes
- a clock data recovery circuit for generating a clock signal from a signal inputted through the IO circuit.

28. The device of claim 27, wherein the IO signal control circuit includes:
- a serial to parallel converting portion for parallel converting the serialized command signals, address signals and data inputted through the IO circuit and applying the parallel converted signals to the internal circuit; and
- a parallel to serial converting portion for serial converting parallel data applied from the internal circuit and outputting the serial converted data to the IO circuit.

29. The device of claim 28, wherein the serial to parallel converting portion includes:
- a command signal serial to parallel converting portion for acquiring and parallel converting the serialized command signals among the serialized command signals, address signals and data inputted through the IO circuit and applying the parallel converted command signals to the internal circuit;
- an address signal serial to parallel converting portion for acquiring and parallel converting the serialized address signals among the serialized command signals, address signals and data inputted through the IO circuit and applying the parallel converted address signals to the internal circuit; and
- a data serial to parallel converting portion for acquiring and parallel converting the serialized data among the serialized command signals, address signals and data inputted through the IO circuit and applying the parallel converted data to the internal circuit.

30. the device of claim 29, wherein the command signal serial to parallel converting portion includes:
- a first DEMUX for receiving and parallel converting a predetermined bit signal corresponding to the number of the command signals; and
- a first DEMUX control portion for activating operation of the first DEMUX if the first DEMUX detects input of the predetermined bit signal having the command signals.

31. The device of claim 29, wherein the address signal serial to parallel converting portion includes:
- a second DEMUX for receiving and parallel converting a predetermined bit signal corresponding to the number of the address signals; and a second DEMUX control portion for activating operation of the second DEMUX if the second DEMUX detects input of the predetermined bit signal having the address signals.

32. The device of claim 29, wherein the data serial to parallel converting portion includes:
   a third DEMUX for receiving and parallel converting a predetermined bit signal corresponding to the number of the address signals; and
   a third DEMUX control portion for activating operation of the third DEMUX if the third DEMUX detects input of the predetermined bit signal having the data.

33. The device of claim 28, wherein the parallel to serial converting portion includes:
   a MUX for serial converting data parallel-inputted from the internal circuit; and
   an output control portion which receives an output signal of the MUX and outputs the output signal of the MUX to the IO circuit only when the semiconductor memory device performs read operation.

* * * * *

UNITED STATES PATENT AND TRADEMARK OFFICE
CERTIFICATE OF CORRECTION

PATENT NO. : 7,336,554 B2
APPLICATION NO. : 11/258565
DATED : February 26, 2008
INVENTOR(S) : Kyu-Hyoun Kim et al.

It is certified that error appears in the above-identified patent and that said Letters Patent is hereby corrected as shown below:

Column 18, Line 10, delete the second occurrence of "serial"

Column 19, line 16, after "parallel" add --converting the command signals, address signals and data which are serialized and applying the parallel--

Column 19, line 24, delete the first occurrence of "the" and insert --The--

Column 20, line 3, delete "," and insert --;--

Signed and Sealed this

Twenty-seventh Day of January, 2009

JOHN DOLL
*Acting Director of the United States Patent and Trademark Office*